(12) United States Patent
Saito

(10) Patent No.: US 6,596,608 B2
(45) Date of Patent: Jul. 22, 2003

(54) METHOD OF MANUFACTURING NON-VOLATILE SEMICONDUCTOR MEMORY DEVICE

(75) Inventor: Kenji Saito, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/177,280

(22) Filed: Jun. 21, 2002

(65) Prior Publication Data

US 2002/0197795 A1 Dec. 26, 2002

(30) Foreign Application Priority Data

Jun. 22, 2001 (JP) ........................................ 2001-189981

(51) Int. Cl.[7] ............................................... H01L 21/76
(52) U.S. Cl. ..................... 438/424; 438/425; 438/426; 438/359; 438/699
(58) Field of Search ................................. 438/424, 425, 438/426, 427, 359, 702, 437, 699

(56) References Cited

U.S. PATENT DOCUMENTS

| | | | | |
|---|---|---|---|---|
| 5,397,731 A | * | 3/1995 | Takemura ..................... | 437/67 |
| 5,455,194 A | * | 10/1995 | Vasquez et al. ............... | 437/67 |
| 5,536,675 A | * | 7/1996 | Bohr ............................ | 437/67 |
| 5,646,063 A | * | 7/1997 | Mehta et al. .................. | 437/67 |
| 5,888,881 A | * | 3/1999 | Jeng et al. .................... | 438/425 |
| 6,207,534 B1 | * | 3/2001 | Chan et al. ................... | 438/427 |
| 6,406,976 B1 | * | 6/2002 | Singh et al. .................. | 438/423 |

FOREIGN PATENT DOCUMENTS

| JP | 01-309373 | 12/1989 |
|---|---|---|
| JP | 10-107167 | 4/1998 |

* cited by examiner

*Primary Examiner*—Stephen D. Meier
*Assistant Examiner*—Renzo N. Rocchegiani
(74) *Attorney, Agent, or Firm*—Katten Muchin Zavis Rosenman

(57) ABSTRACT

To provide a method for producing a non-volatile semiconductor memory device that can form trenches having different depths in a reduced number of processes. A method for producing a non-volatile semiconductor memory device having a memory cell region and a peripheral circuit region includes steps of forming a gate insulation film on a semiconductor substrate, forming a floating gate film on the gate insulation film on the memory cell region and then etching the floating gate film, forming an etching mask having a first opening and a second opening, etching the gate insulation film until the semiconductor substrate is exposed from the second opening, etching the floating gate film and the gate insulation film until the semiconductor substrate is exposed from the first openings and at the same time etching the semiconductor substrate exposed from the second opening, etching the semiconductor substrate exposed from the first openings and the second opening simultaneously, and filling respective trenches formed by etching with an insulating material.

19 Claims, 18 Drawing Sheets

METHOD OF MANUFACTURING NON-VOLATILE SEMICONDUCTOR MEMORY DEVICE

FIELD OF THE INVENTION

The present invention relates to a method for producing a nonvolatile semiconductor memory device. More specifically, the invention relates to a method for producing a non-volatile semiconductor memory device in which trenches in a memory cell region and trenches in other regions having a depth different from the depth of the trench in the memory cell region are formed in a reduced number of processes.

BACKGROUND OF THE INVENTION

Large-scale integration of a semiconductor device that uses a silicon substrate is realized by providing a device isolating region between a plurality of transistors. As the device isolating regions used in the semiconductor device, there are a P-N junction isolating region, a LOCOS (local Oxidation of Silicon)-type field insulating film, and a trench isolating region. P-N junction isolating regions and trench isolating regions become device isolating regions for such devices as those in a collector region of a bipolar transistor having a deep P-N junction. The field insulating film, on the other hand, becomes a device isolating region between devices formed on the silicon substrate and wires provided on the silicon substrate, or a device isolating region for such devices as those in a source/drain regions of a MOS transistor having a shallow P-N junction.

The field insulating film has been employed for a device isolating region for a semiconductor device that comprises MOS transistors, and the field insulating film and either one of the P-N junction isolating region and the trench isolating region have been employed as a device isolating region for a semiconductor device that comprises bipolar transistors. With a progress of device miniaturization, special emphasis is placed on a self-alignment technique, and reduced size of a device isolating region are also pursued. Thus, in the semiconductor device that comprises the MOS transistors, an LOCOS-type field insulating film has become mainstream, while in the semiconductor device that comprises bipolar transistors, a combined use of the LOCOS-type field insulating film and the trench isolating region has become mainstream.

In the semiconductor device that comprises the MOS transistors, P-channel MOS transistors were mainly used at first. However, N-channel MOS transistors came into use, and now CMOS transistors have been mainly used. In a semiconductor device comprising the CMOS transistors, either one of an N well or a P well was employed. Recently, both N and P wells, that is, twin wells are employed. For this reason, even in the semiconductor device that comprises MOS transistors, a device isolating region for N and P wells having the deep P-N junction becomes necessary. In addition, use of a trench isolating region has begun to be studied as a measure against latch-up. Further, a BiCMOS transistor that comprises a CMOS transistor and a bipolar transistor has been spotlighted, so that the importance of the device isolating region that comprises a LOCOS-type field oxide film and a trench isolating region has increased.

Next, device isolating structures in a conventional non-volatile semiconductor device will be described with reference to a drawing. Referring to FIG. 18d, the non-volatile semiconductor device comprises a memory cell region 20, a device isolating region 21, and a peripheral circuit region 22. In the memory cell region 20, there is provided between cells device a device isolator 8a filled into a trench that penetrates through a first silicon oxide film 3 and extends into a silicon substrate 1. In the device isolating region 21, there is provided a field oxide film 2 formed on the surface of the silicon substrate 1 by a LOCOS process and a device isolator 8b filled into a trench that penetrates through the field oxide film 2 and extends into the silicon substrate 1. In the peripheral circuit region 22, there is provided between transistors a device isolator 8c which has been filled into a trench that penetrates through the first silicon oxide film 3 and extends into the silicon substrate 1. Generally, a silicon oxide film is employed for the device isolators 8a, 8b and 8c.

A conventional typical method for producing the device isolators will be described.

The field oxide film 2 and the first silicon oxide film 3 that becomes a first gate insulating film are formed on the silicon substrate 1 by the LOCOS and thermal oxidation processes. Then, a silicon nitride film 6 is formed on the field oxide film 2 and the first silicon oxide film 3. Thereafter, a resist 7 for forming trenches in the respective regions is formed (see FIG. 18a).

Next, in the respective regions, the trenches having the same depth from an interface between the silicon substrate 1 and the field oxide film 2 and from an interface between the silicon substrate 1 and the first silicon oxide film 3 are formed (see FIG. 18b).

Then, after removing the resist 7, the trenches are filled with insulating films such as a silicon oxide film. The device isolators 8a, 8b and 8c are thereby formed.

Then, the silicon oxide film 3 is removed from the peripheral circuit region 22 to form a p-well 30, and then a gate insulation film 32 is selectively formed on the surface of the peripheral circuit region 22. Thereafter, floating gates 4 are formed on the memory cell region (see FIG. 18c).

Next, an ONO film 9 is selectively formed on the floating gates 4, and then control gates 10a are formed on the memory cell region, and gates 10b and 10c are formed on the peripheral circuit region.

An N-type diffusion layer 31 that becomes source/drain regions are formed with respect to the gates 10b and 10c on the peripheral circuit region (see FIG. 18d). With this arrangement, a source/drain region associated with the gate 10b and a source/drain region associated with the gate 10c are isolated by the device isolator 8c.

SUMMARY OF THE DISCLOSURE

Forming of trenches in the respective regions with the same depth from the interface between the silicon substrate 1 and the field oxide film 2 and from the interface between the silicon substrate 1 and the first silicon oxide film 3 in the above-mentioned way, results in the following problems.

The device isolators 8a that achieve isolation between memory devices on the memory cell region 20 and the device isolator 8c that achieves isolation between source/drain regions for adjacent transistors on the peripheral circuit region 22 have optimum depths, respectively. Since an impurity diffusion region that becomes source wiring is formed under the trenches filled with the device isolators 8a, the depth of the device isolator 8a cannot be made to be so deep.

On the other hand, if the depth of the device isolator 8c is shallow, a parasitic bipolar transistor is formed between the source and the drain of adjacent transistors, so that so-called latch-up may occur. Thus, the depth of the device isolator 8c cannot be made to be so shallow.

In other words, if the depth of the source/drain regions for the transistors become close to the depth of the device isolator 8c, the parasitic effects of an npn bipolar transistor arise, where a source/drain region 31 between the adjacent transistors is made to be an emitter and a collector, and the p-well 30 is made to be a base. Thus, it is necessary for the device isolator 8c to have a depth just sufficient for ensuring isolation of the source/drain regions 31.

In short, if the depth of the device isolator 8c is adjusted to the depth required for the device isolators 8a, latch-up might occur in the peripheral circuit region 22.

On the contrary, if the depth of the device isolators 8a is adjusted to the depth required for the device isolator 8c, formation of source wiring under the trenches filled with the device isolators 8a becomes difficult.

In order to solve the problems described above, separate formation of trenches in the respective regions can be conceived. However, if the separate formation is performed, number of the photo-lithography processes increases, thereby leading to a rise in cost.

In such a publication as JP Patent Kokai JP-A-01-309373, a technique for forming trenches having different depths in a single process is described. In this technique, a silicon oxide film having a desired thickness is formed in advance on a region where shallow trenches are to be formed. Then, utilizing an etching rate difference between the silicon oxide film and silicon, trenches having different depths can be formed.

However, for formation of the silicon oxide film in advance, a dedicated photo-lithography process is required. Thus, though a reduction in the number of processes to a certain extent is achieved in view of the number of the processes required for filling the trenches, a substantial reduction in lithography processes cannot be brought about.

On the contrary, the number of the lithography processes increases. Further, in order to form trenches having different depths, a layer or a silicon oxide film for adjusting the depths of the trenches, which will be removed in the future, must be formed. Therefore it takes much more time to perform all of the manufacturing processes.

In JP Patent Kokai JP-A-10-107167, a technique for fabricating cell arrays isolated by trenches is described. In this technique, a tunnel oxide film, floating gates, a silicon oxide film, and a silicon nitride film are deposited on a substrate in this order.

Then, the silicon nitride film, silicon oxide film, floating gates, tunnel oxide film, and silicon substrate are etched in a stripe form continuously in this order. Then, after the silicon oxide film is filled into the trenches, grinding or planarization is performed by using a CMP technique until the silicon nitride film is exposed.

Thereafter, the silicon nitride film and the silicon oxide film on the floating gate are removed. By patterning in the channel width direction in this way, the width of a channel and the width of a floating gate are determined in a self-alignment manner.

However, when a memory is formed, or when the widths of the channel and the floating gate are determined by the self-alignment technique, device isolation in the peripheral circuit region other than the memory cell region had to be performed in a separate process, by trench isolation or LOCOS isolation. For this reason, it takes much time to perform all of the manufacturing processes, thereby increasing the cost of manufacturing.

Especially when a device isolator corresponding to the device isolator 8c in FIG. 18 is to be employed in commonly used transistors on the peripheral circuit region for miniaturization, the number of the processes is further increased.

The present invention has been made to overcome the problems described above.

Accordingly, it is an object of the present invention to provide a method for producing a non-volatile semiconductor memory device in which trenches having different depths can be formed in a reduced number of processes.

The above object and other objects of the invention are satisfied, at least in part, in accordance with one aspect of the present invention, by providing a method for producing a non-volatile semiconductor memory device having a memory cell region and a peripheral circuit region, said memory cell region including a plurality of memory cells each comprising a floating-gate transistor, said peripheral circuit region including at least a transistor circuit in a periphery of said memory cell region, said method comprising:

a first step of forming a gate insulation film on a semiconductor substrate;

a second step of forming a floating gate film on said gate insulation film and then selectively etching said floating gate film on said peripheral circuit region;

a third step of forming an etching mask having at least a first opening and a second opening respectively over said floating gate film and said gate insulation film, said first opening being provided to expose a part of said floating gate film on said memory cell region, said second opening being provided to expose a part of said gate insulation film on said peripheral circuit region;

a fourth step of selectively etching said gate insulation film until said semiconductor substrate is exposed from said second opening;

a fifth step of etching said floating gate film exposed from said first opening and said gate insulation film under said floating gate film, and etching said semiconductor substrate exposed from said second opening simultaneously, until said semiconductor substrate is exposed from said first opening;

a sixth step of simultaneously etching said semiconductor substrate exposed respectively from said first opening and said second opening; and a seventh step of removing said etching mask and then filling respective trenches formed by said sixth step of etching with an insulating material.

In accordance with a second aspect of the present invention, there is provided a method for producing a non-volatile semiconductor memory device having a memory cell region, a peripheral circuit region, and a device isolating region on a semiconductor substrate, said memory cell region having a plurality of memory cells each comprising a floating-gate transistor, said peripheral circuit region including at least a transistor circuit in a periphery of said memory cell region, said device isolating region for isolating devices on said memory cell region from devices on said peripheral circuit region, said method comprising:

a first step of forming a field insulating film on said device isolating region and then forming a gate insulation film on said memory cell region and said peripheral circuit region;

a second step of forming a floating gate film on said gate insulation film and then selectively etching said floating gate film on said peripheral circuit region;

a third step of forming an etching mask having at least a first opening and a third opening, said first opening being provided to expose a part of said floating gate film on said memory cell region, said third opening being provided to expose a part of said field insulating film on said device isolating region;

a fourth step of selectively etching said field insulating film exposed from said third opening until said semiconductor substrate is exposed from said third opening;

a fifth step of etching said floating gate film exposed from said first opening and said gate insulation film under said floating gate film, and etching said semiconductor substrate exposed from said third opening simultaneously, until said semiconductor substrate is exposed from said first opening;

a sixth step of simultaneously etching said semiconductor substrate exposed respectively from said first opening and said third opening; and a seventh step of removing said etching mask and then filling respective trenches formed by said sixth step of etching with an insulating material.

In accordance with a third aspect of the present invention, there is provided a method for producing a non-volatile semiconductor memory device having a memory cell region, a peripheral circuit region, and a device isolating region on a semiconductor substrate, said memory cell region having a plurality of memory cells each comprising a floating-gate transistor, said peripheral circuit region including at least a transistor circuit in a periphery of said memory cell region, said device isolating region for isolating devices on said memory cell region from devices on said peripheral circuit region, said method comprising:

a first step of forming a field insulating film on said device isolating region and then forming a gate insulation film on said memory cell region and said peripheral circuit region;

a second step of forming a floating gate film on said gate insulation film and then selectively etching said floating gate film on said peripheral circuit region;

a third step of forming an etching mask having at least a first opening, a second opening, and a third opening, said first opening being provided to expose a part of said floating gate film on said memory cell region, said second opening being provided to expose a part of said gate insulation film on said peripheral circuit region, said third opening being provided to expose a part of said field insulating film on said device isolating region;

a fourth step of selectively etching said gate insulation film exposed from said second opening and said field insulating film exposed from said third opening until said semiconductor substrate is exposed from said second opening and said third opening;

a fifth step of etching said floating gate film exposed from said first opening and said gate insulation film under said floating gate film, and etching said semiconductor substrate exposed from said second opening and said third opening simultaneously, until said semiconductor substrate is exposed from said first opening;

a sixth step of simultaneously etching said semiconductor substrate respectively exposed from said first opening, said second opening, and said third opening; and a seventh step of removing said etching mask and then filling respective trenches formed by said sixth step of etching with an insulating material.

In the method for producing a non-volatile semiconductor memory device, in accordance with the present invention, in the fifth step, it is preferable that, after simultaneously etching the floating gate film exposed from the first openings and the semiconductor substrate exposed from the second opening or the third opening until the gate insulation film is exposed from the first openings, the gate insulation film exposed from the first openings is selectively etched until the semiconductor substrate is exposed from the first openings.

In addition, in accordance with the present invention, it is preferable that the method for producing a non-volatile semiconductor memory device further comprises after the seventh step:

the eighth step of forming a well in the semiconductor substrate in the peripheral circuit region.

Further, in the method for producing a non-volatile semiconductor memory device, in accordance with the present invention, it is preferable that a trench formed in the peripheral circuit region is deeper than trenches formed in the memory cell region.

Still further, in the method for producing a non-volatile semiconductor memory device, in accordance with the present invention, it is preferable that the trench formed in the peripheral circuit region is deeper than a well formed in the peripheral circuit region.

In the method for producing a non-volatile semiconductor memory device, in accordance with the present invention, it is preferable that the trenches formed in the memory cell region isolate floating gates of the respective memory cells.

In the method for producing a non-volatile semiconductor memory device, in accordance with the present invention, it is preferable that the trench formed in the peripheral circuit region is formed in a source/drain region between adjacent transistors.

In the method of manufacturing a non-volatile semiconductor memory device, in accordance with the present invention, it is preferable that the etching mask is a photoresist.

In the method of manufacturing a non-volatile semiconductor memory device, in accordance with the present invention, it is preferable that the etching mask is a CMP stopper.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 7A, 7B6, 7C, and 7D are sectional views schematically showing a sixth step in the method of manufacturing the non-volatile semiconductor memory device according to the embodiment of the present invention;

PREFERRED EMBODIMENTS OF THE INVENTION

Figure 1:
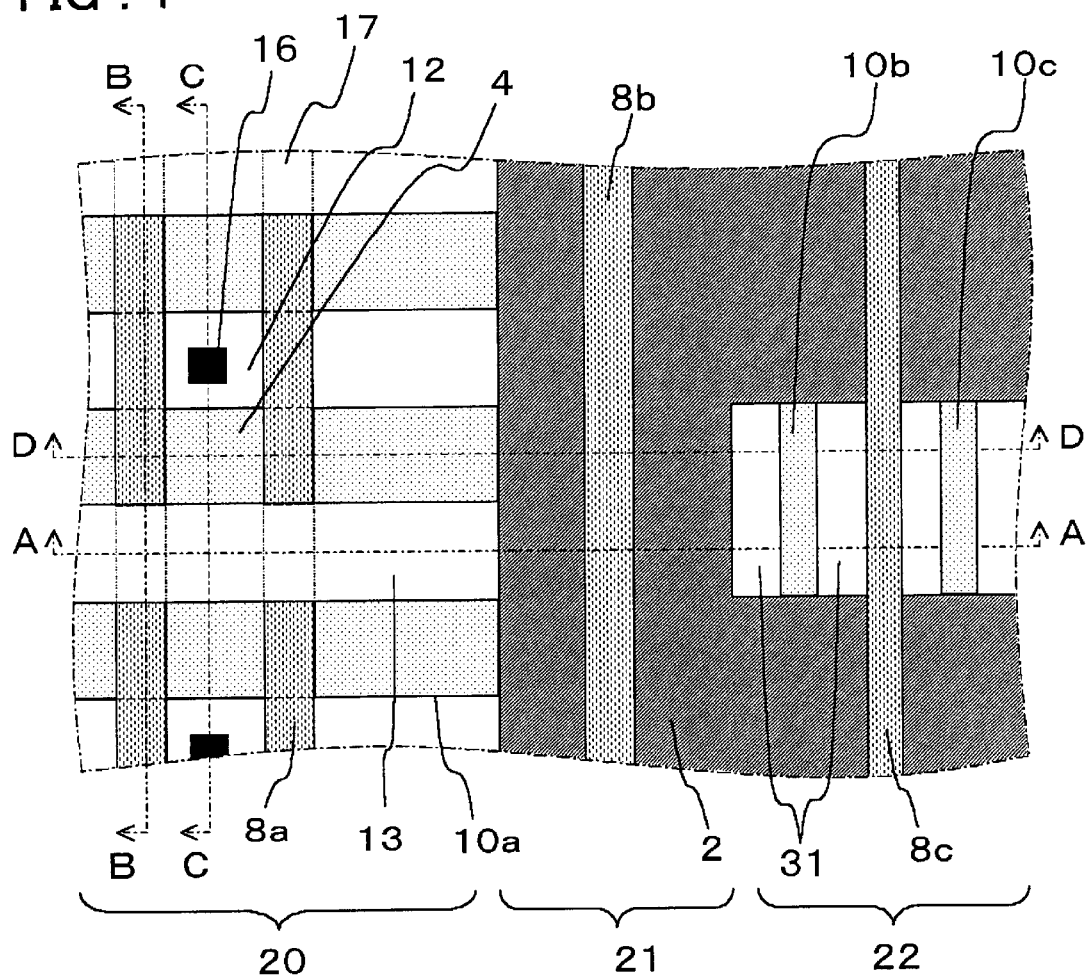
FIG. 1 is a partial plan view schematically showing a configuration of a non-volatile semiconductor memory device according to an embodiment of the present invention.
Figure 2A:
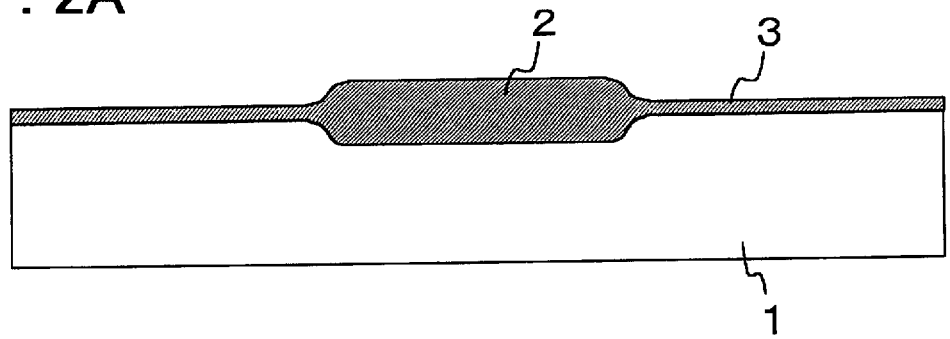
FIGS. 2A, 2B, 2C, and 2D are sectional views schematically showing a first step in a method of manufacturing the non-volatile semiconductor memory device according to the embodiment of the present invention.
Figure 2B:
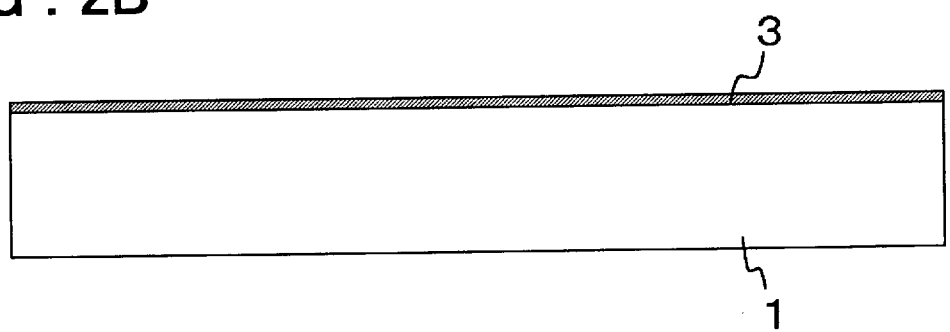
Figure 2C:
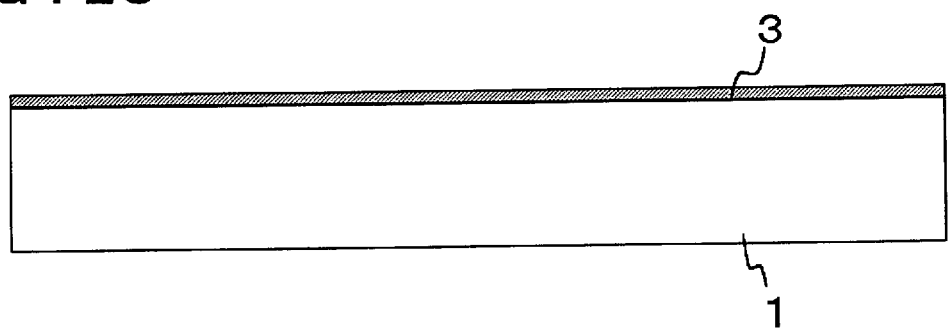
Figure 2D:
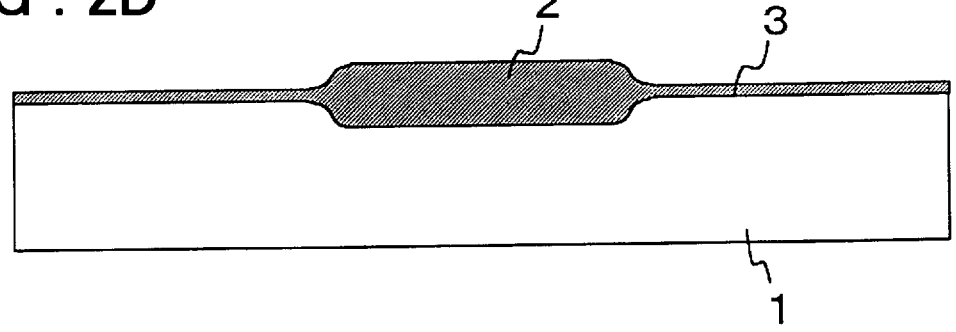
Figure 3A:
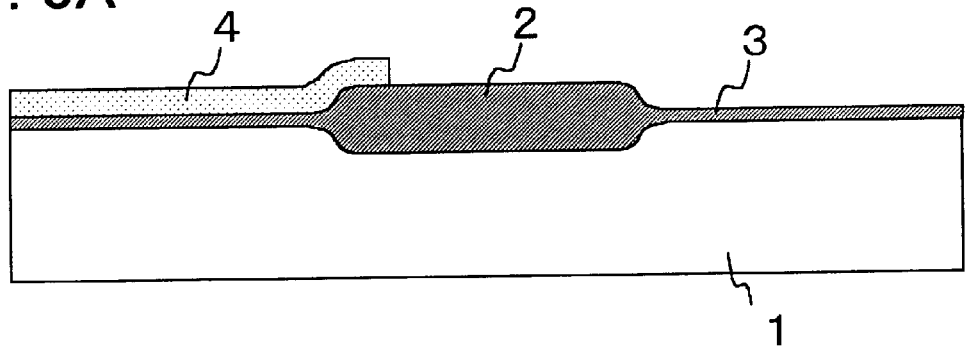
FIGS. 3A, 3B, 3C, and 3D are sectional views schematically showing a second step in the method of manufacturing the non-volatile semiconductor memory device according to the embodiment of the present invention.
Figure 3B:
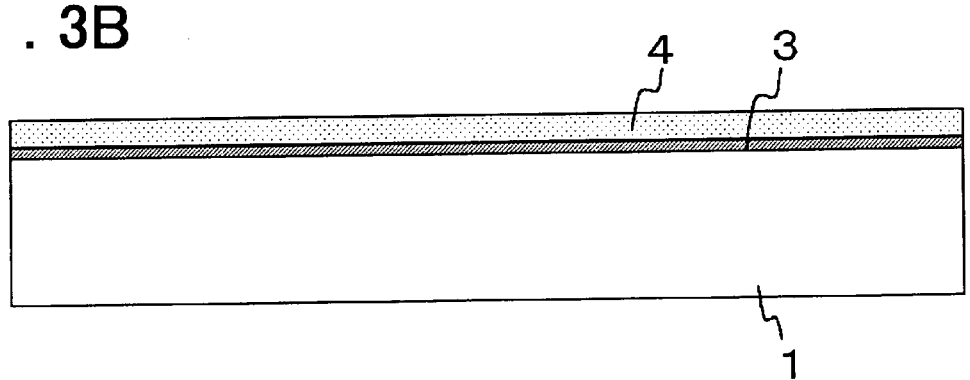
Figure 3C:
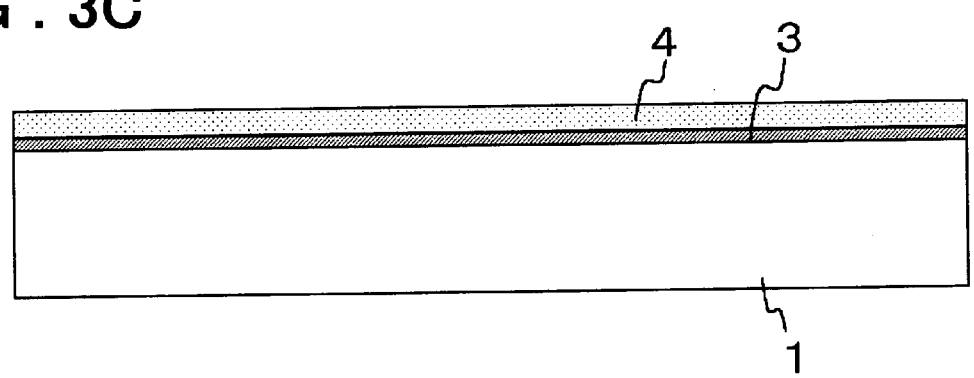
Figure 3D:
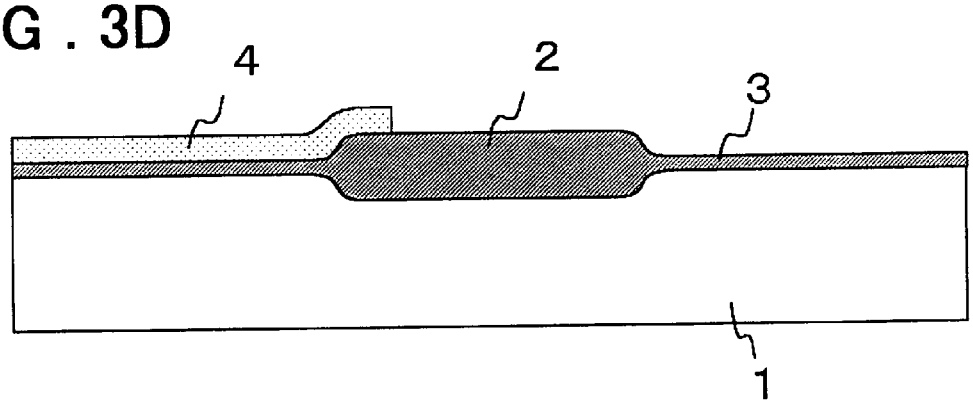
Figure 4A:
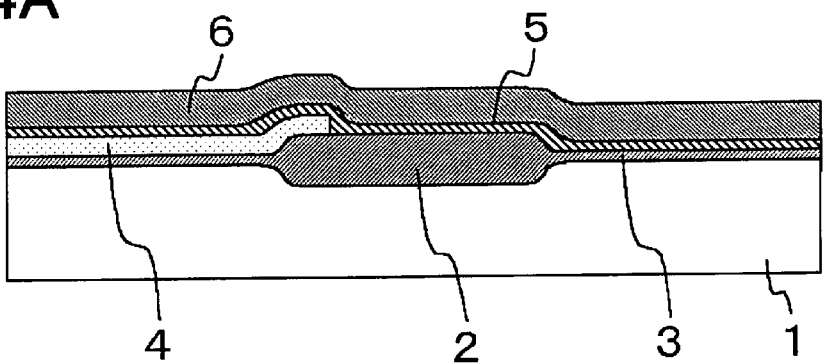
FIGS. 4A, 4B, 4C, and 4D are sectional views schematically showing a third step in the method of manufacturing the non-volatile semiconductor memory device according to the embodiment of the present invention.
Figure 4B:
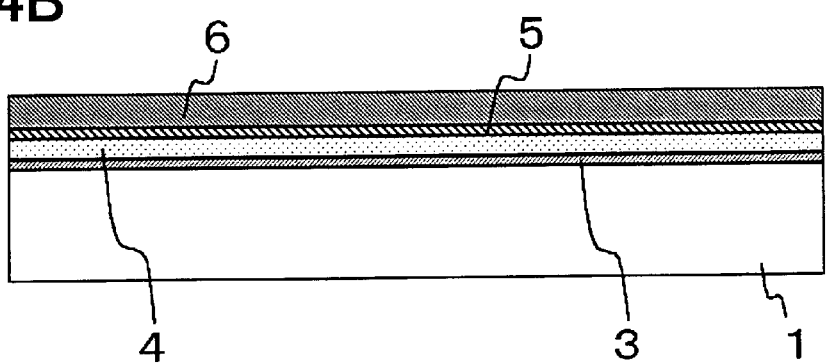
Figure 4C:
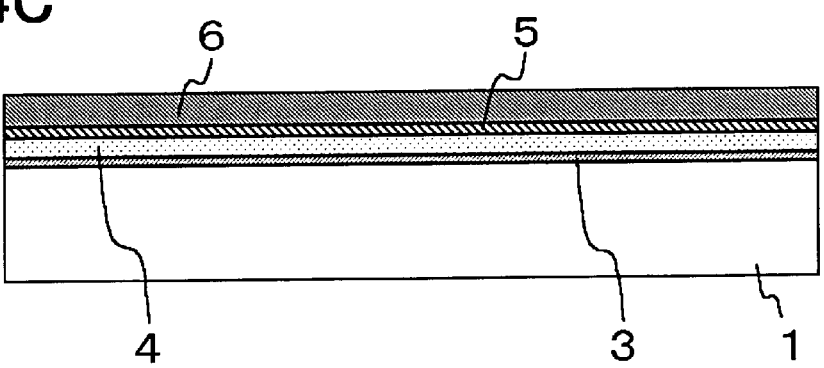
Figure 4D:
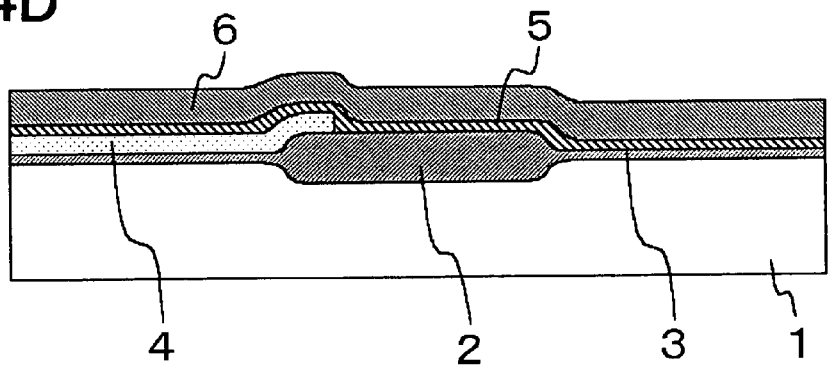
Figure 5A:
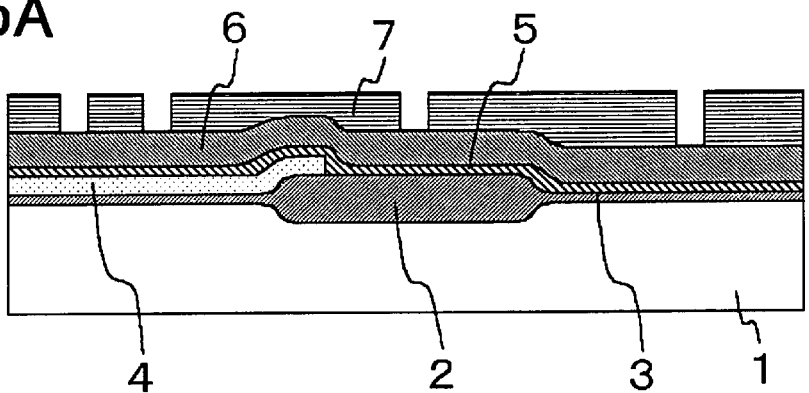
FIGS. 5A, 5B, 5C, and 5D are sectional views schematically showing a fourth step in the method of manufacturing the non-volatile semiconductor memory device according to the embodiment of the present invention.
Figure 5B:
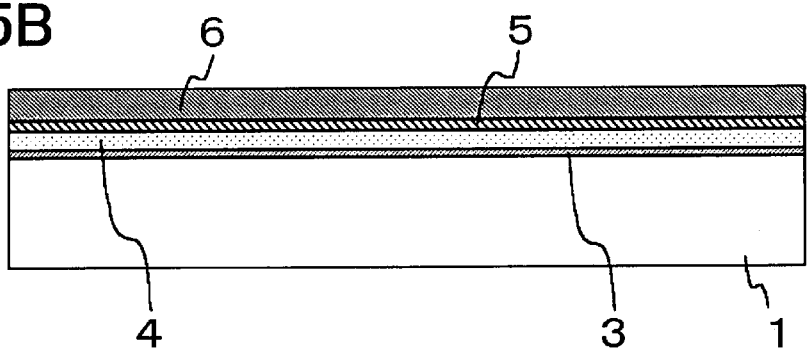
Figure 5C:
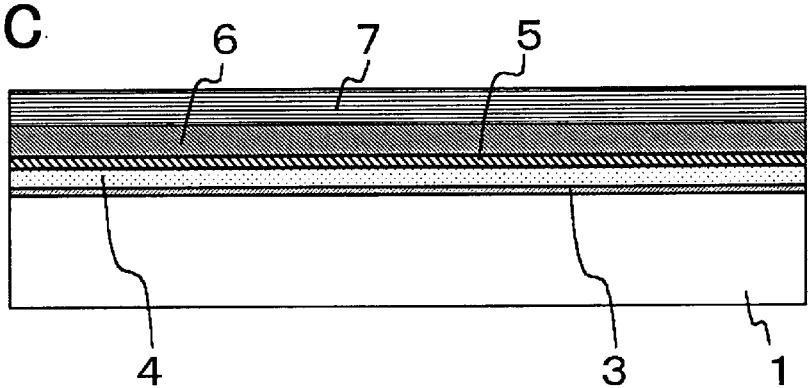
Figure 5D:
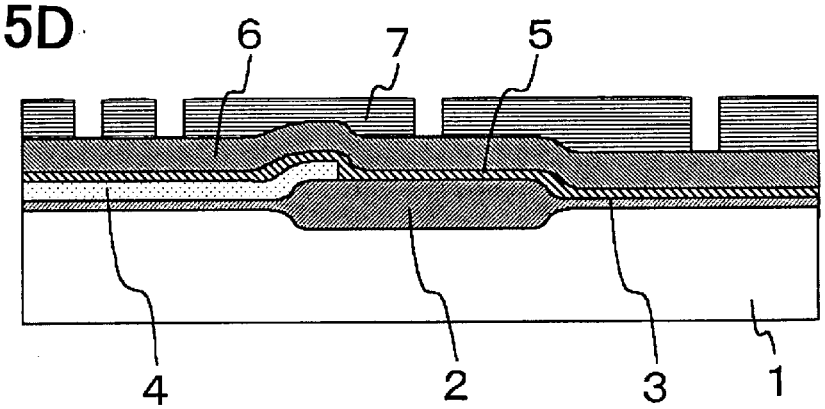
Figure 6A:
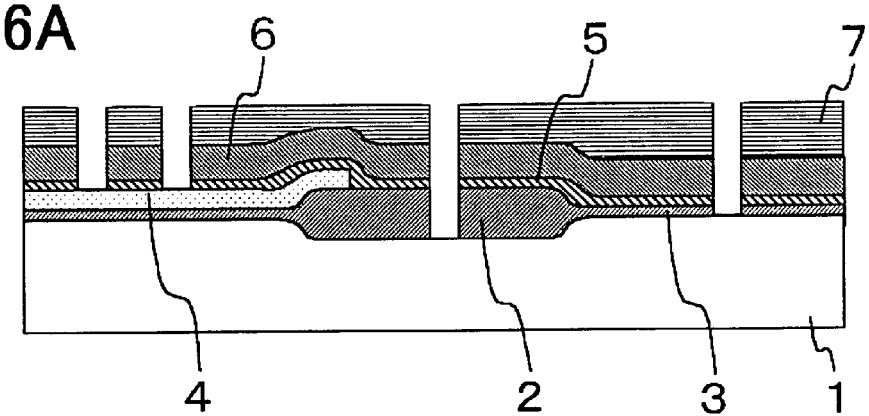
FIGS. 6A, 6B, 6C, and 6D are sectional views schematically showing a fifth step in the method of manufacturing the non-volatile semiconductor memory device according to the embodiment of the present invention.
Figure 6B:
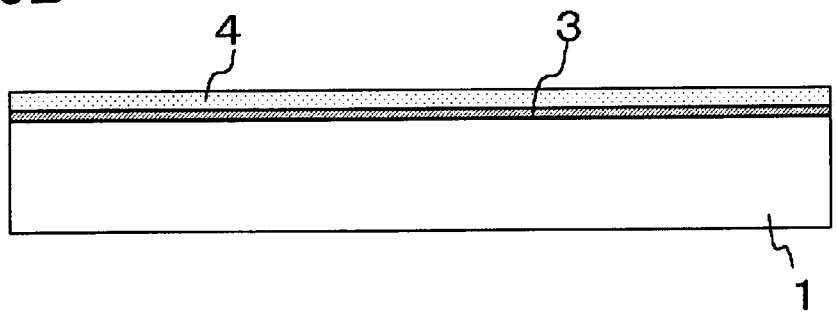
Figure 6C:
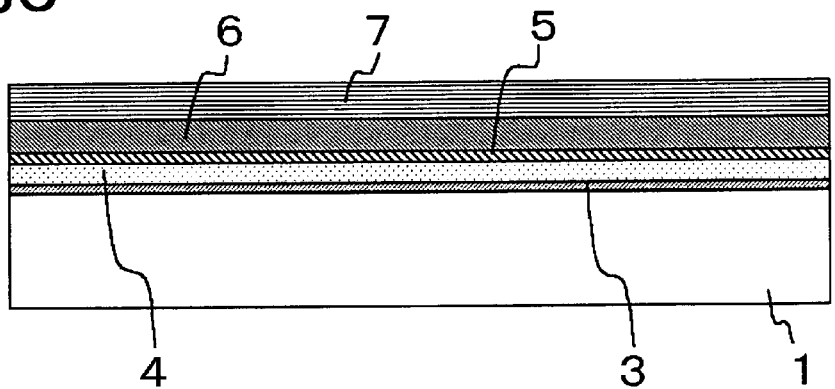
Figure 6D:
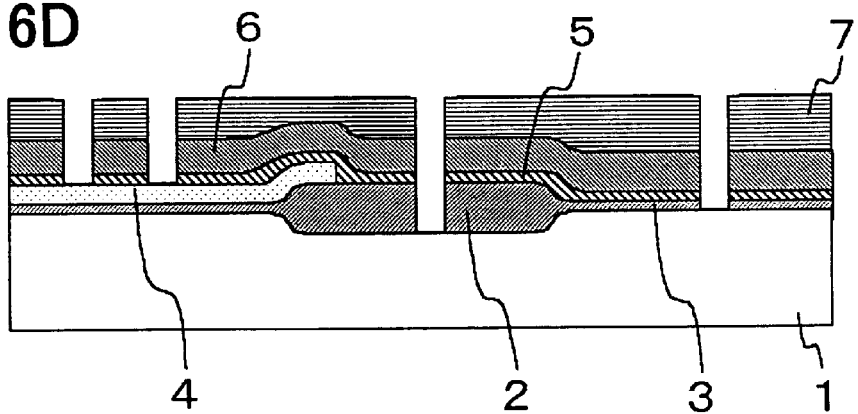
Figure 7A:
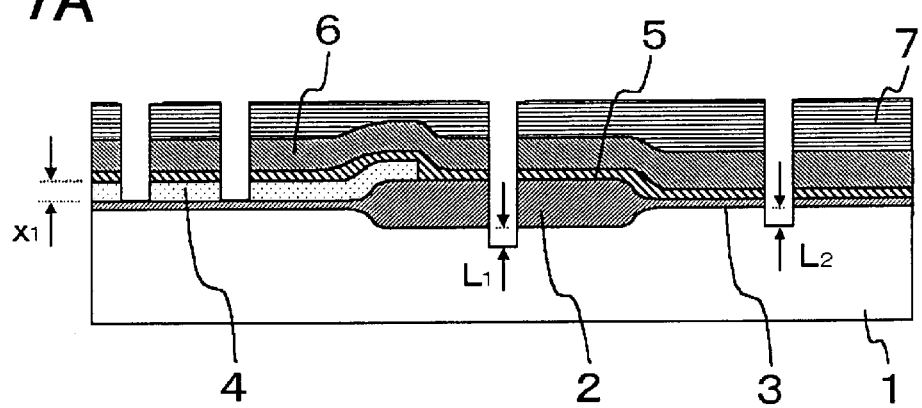
Figure 7B:
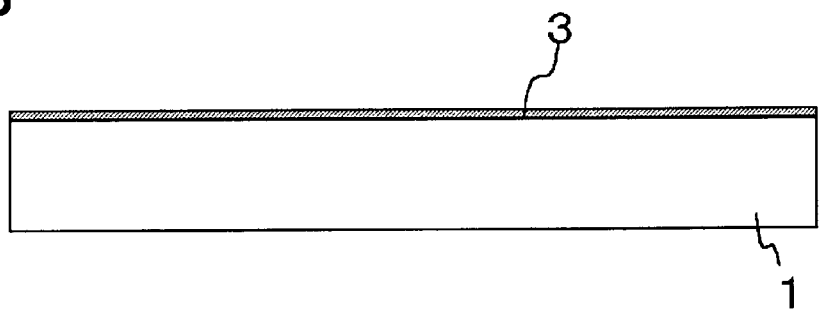
Figure 7C:
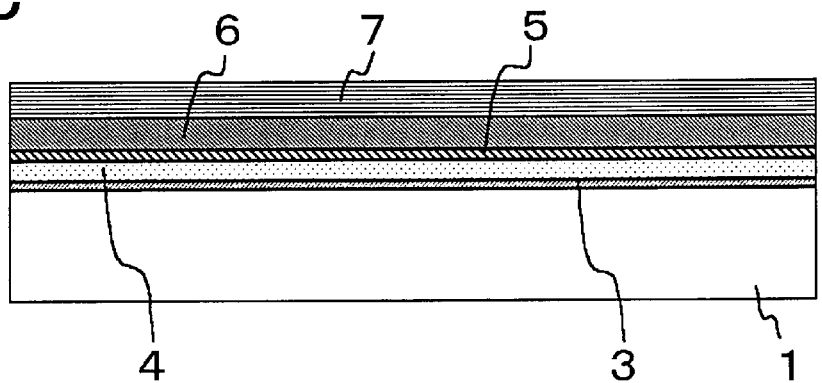
Figure 7D:
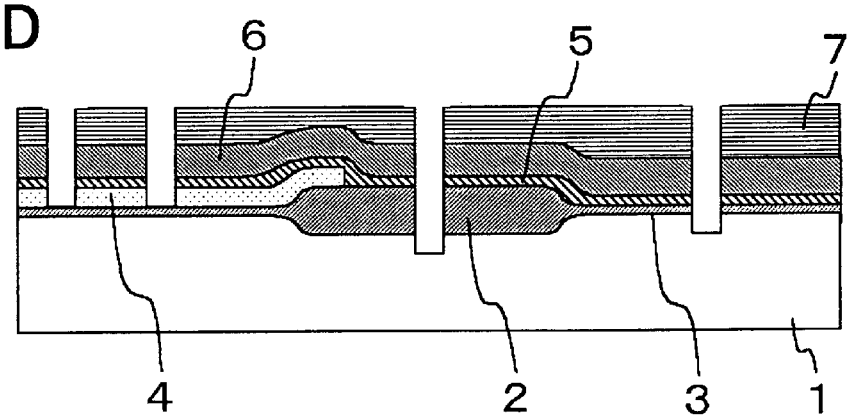
Figure 8A:
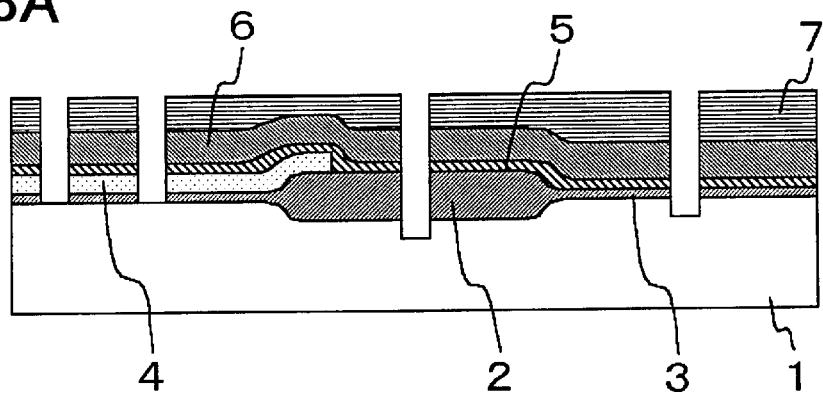
FIGS. 8A, 8B, 8C, and 8D are sectional views schematically showing a seventh step in the method of manufacturing the non-volatile semiconductor memory device according to the embodiment of the present invention.
Figure 8B:
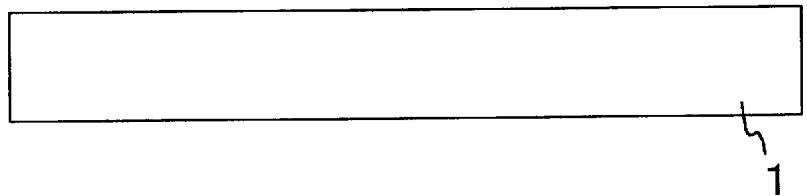
Figure 8C:
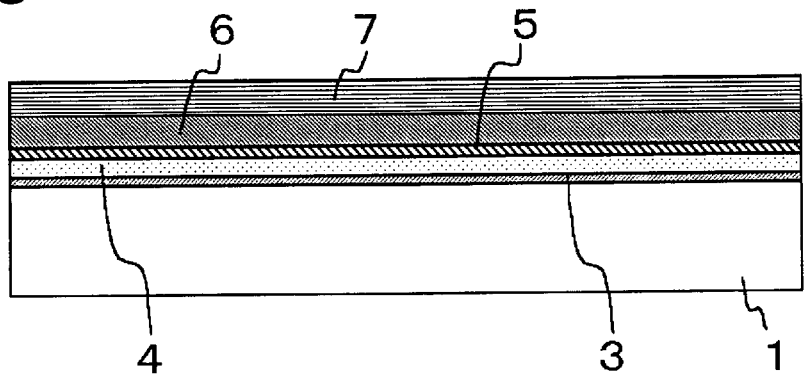
Figure 8D:
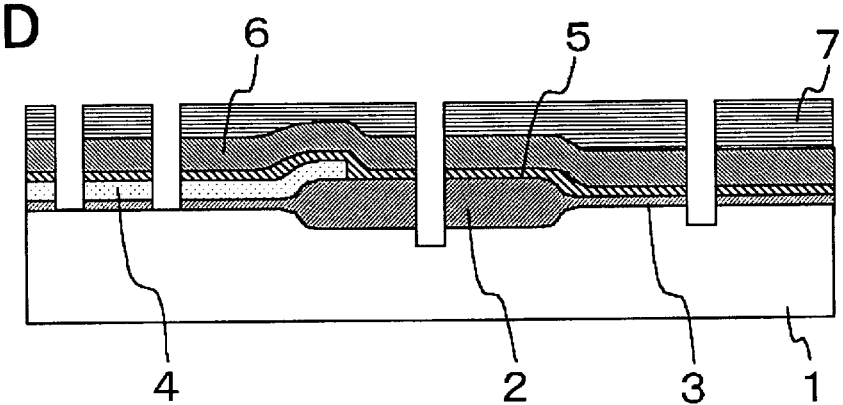
Figure 9A:
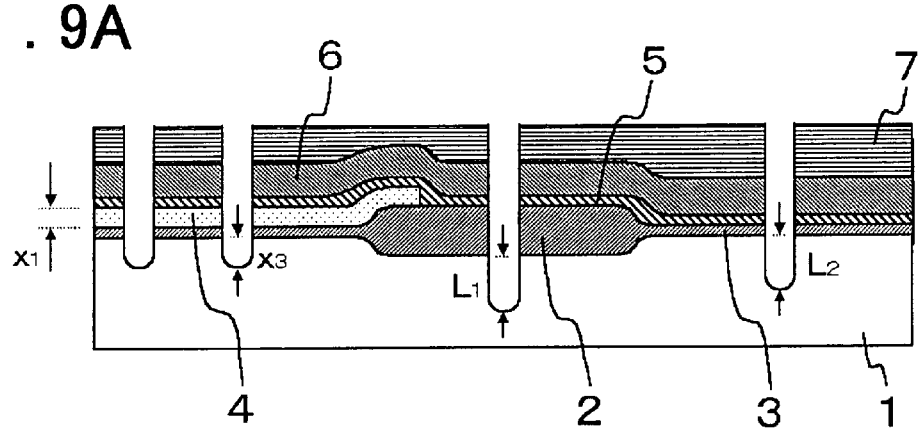
FIGS. 9A, 9B, 9C, and 9D are sectional views schematically showing a eighth step in the method of manufacturing the non-volatile semiconductor memory device according to the embodiment of the present invention.
Figure 9B:
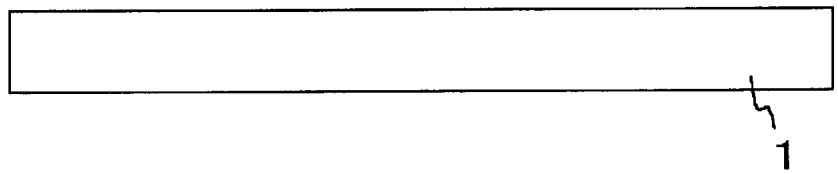
Figure 9C:
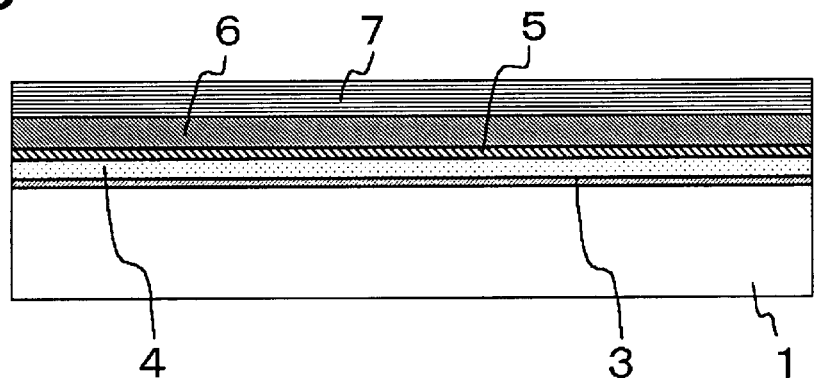
Figure 9D:
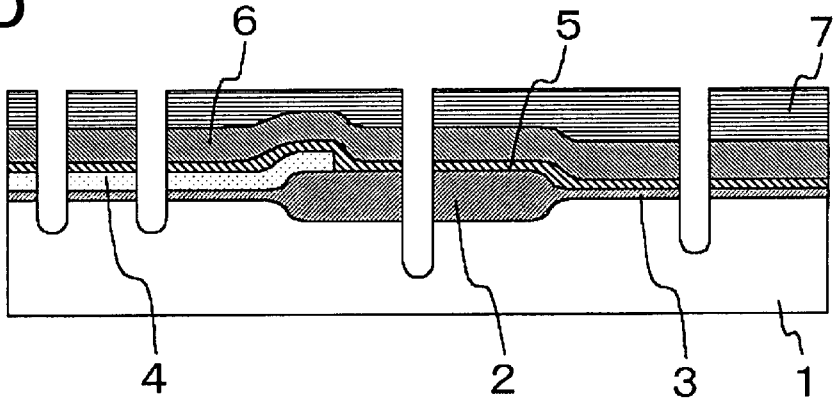
Figure 10A:
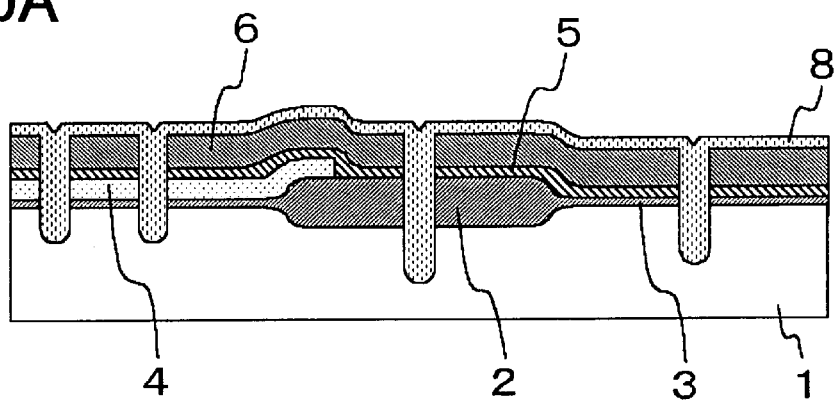
FIGS. 10A, 10B, 10C, and 10D are sectional views schematically showing a ninth step in the method of manufacturing the non-volatile semiconductor memory device according to the embodiment of the present invention.
Figure 10B:
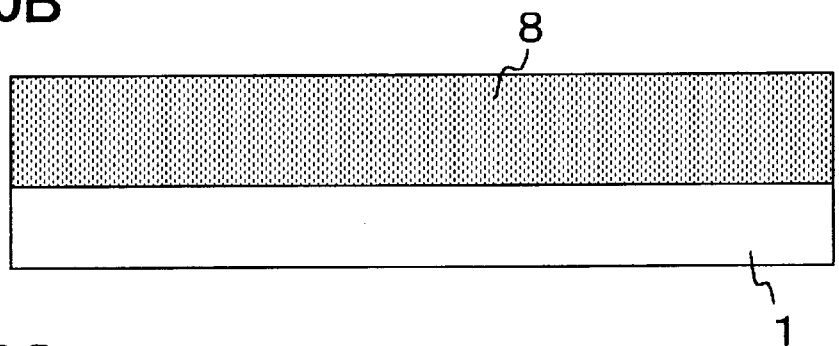
Figure 10C:
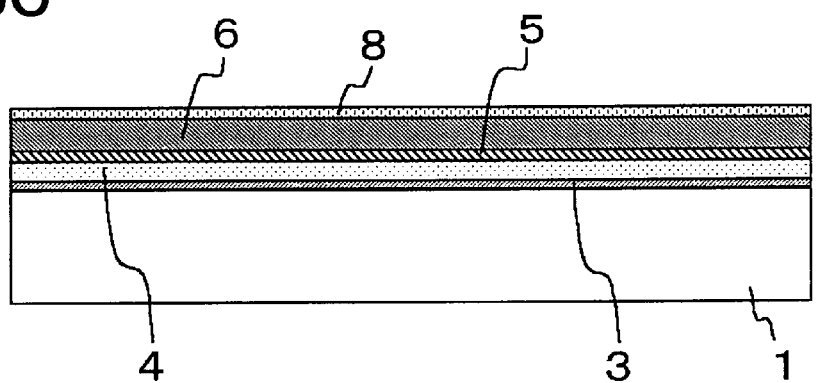
Figure 10D:
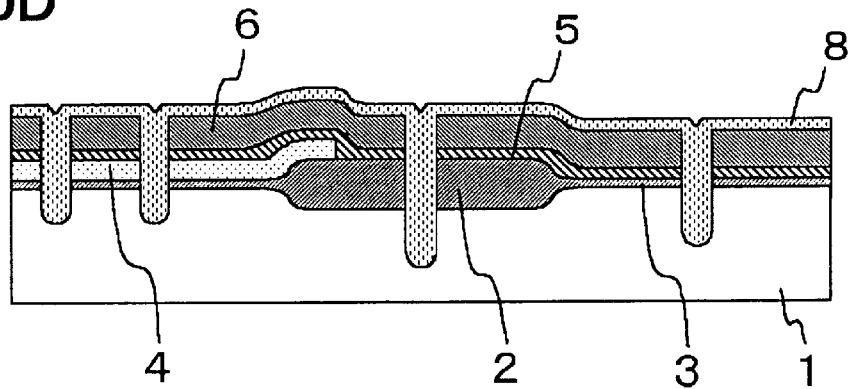
Figure 11A:
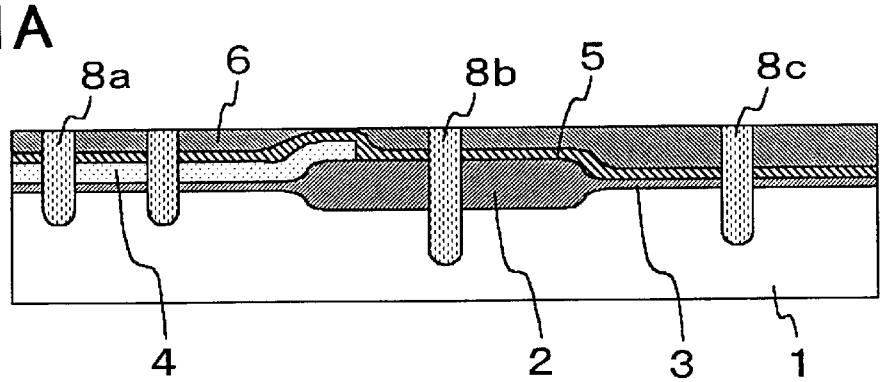
FIGS. 11A, 11B, 11C, and 11D are sectional views schematically showing a tenth step in the method of manufacturing the non-volatile semiconductor memory device according to the embodiment of the present invention.
Figure 11B:
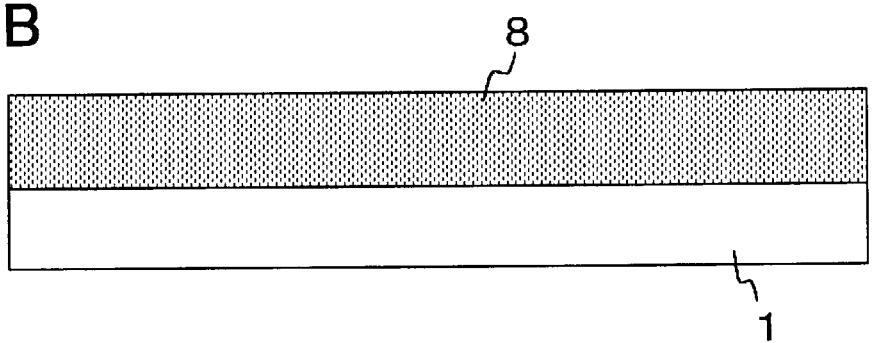
Figure 11C:
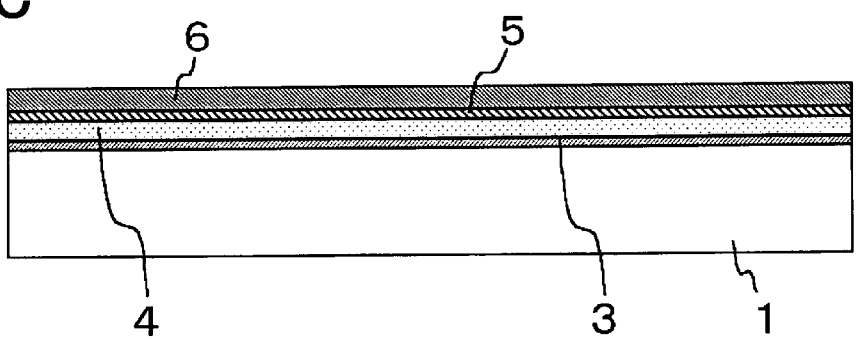
Figure 11D:
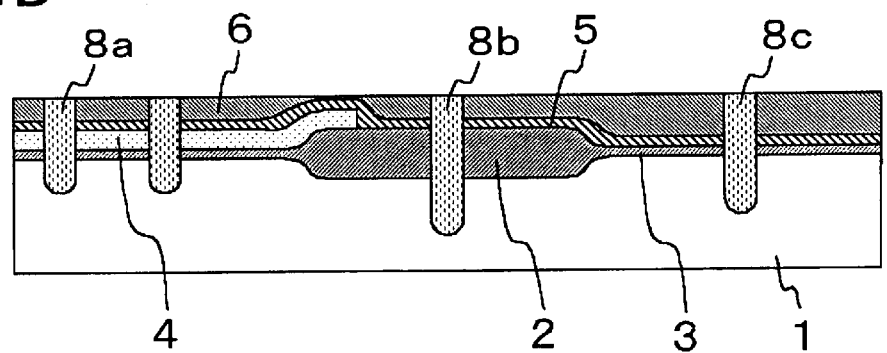
Figure 12:
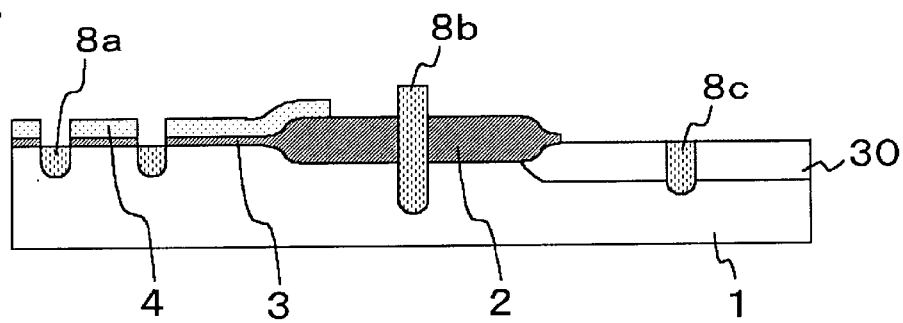
FIGS. 12A, 12B, 12C, and 12D are sectional views schematically showing an eleventh step in the method of manufacturing the non-volatile semiconductor memory device according to the embodiment of the present invention.
Figure 12B:
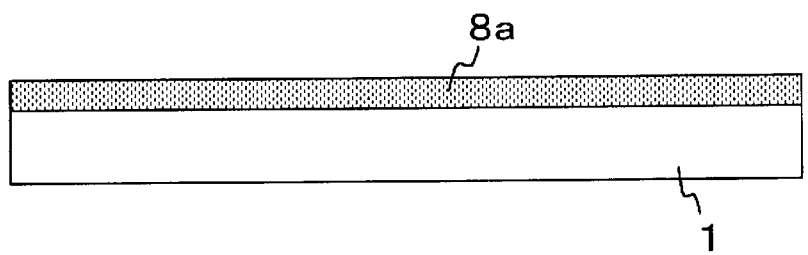
Figure 12C:
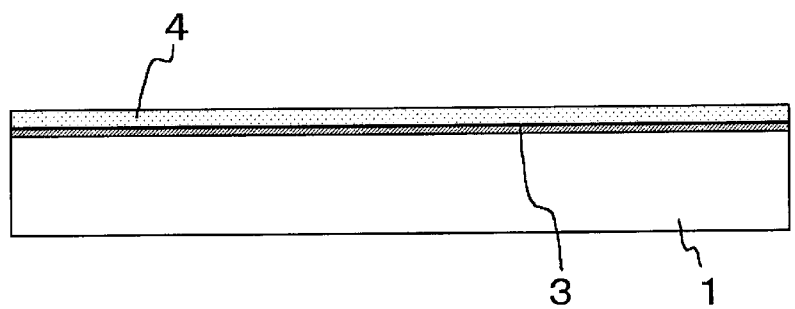
Figure 12D:
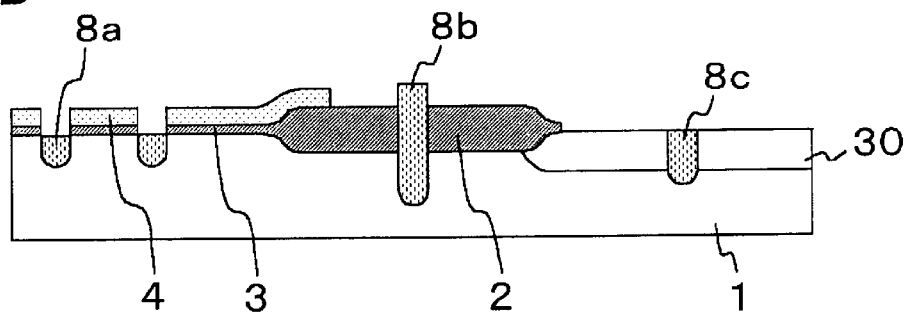
Figure 17A:
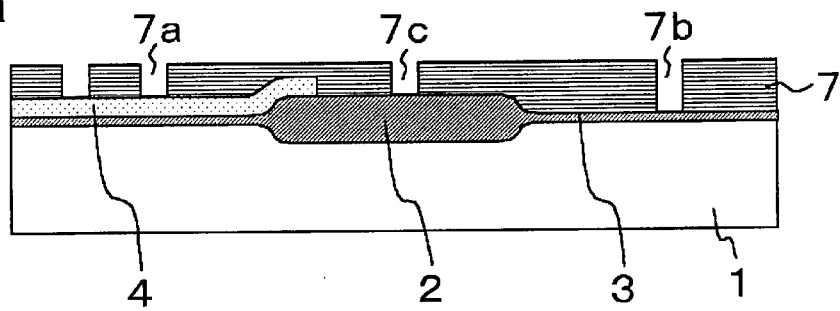
FIGS. 17a, 17b, 17c, 17d, and 17e are sectional views schematically showing steps in the method of manufacturing a non-volatile semiconductor memory device according to another embodiment of the present invention.
Figure 17B:
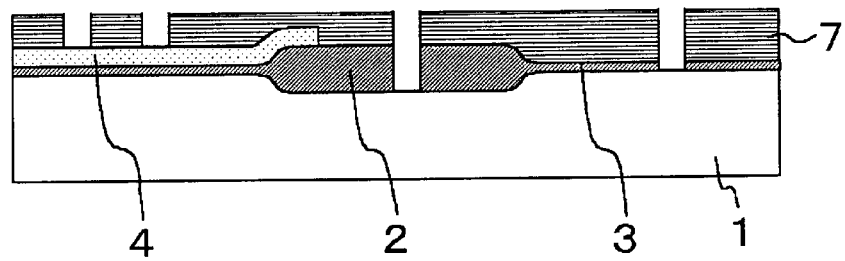

Preferred embodiments of the invention will be described below. A method for producing a non-volatile semiconductor memory device in accordance with one embodiment of the invention, in which the non-volatile semiconductor memory device has a memory cell region indicated by reference numeral 20 in FIG. 17e including a plurality of memory cells each having a floating-gate transistor, a peripheral circuit region indicated by reference numeral 22 in FIG. 17e including circuits with transistors in a peripheral region other than the memory cell region comprises:

first step of forming a gate insulation film indicated by reference numeral 3 in FIG. 17a on a semiconductor substrate indicated by reference numeral 1 in FIG. 17a, second step of forming a floating gate film indicated by reference numeral 4 in FIG. 17a on the gate insulation film and then selectively etching the floating gate film on the peripheral circuit region, third step of forming an etching mask indicated by reference numeral 7 in FIG. 17a having a first opening indicated by reference numeral 7a in FIG. 17a for exposing a part of the floating gate film on the memory cell region and a second opening indicated by reference numeral 7b in FIG. 17a for exposing a part of the gate insulation film on the peripheral circuit region, over the floating gate film and the gate insulation film, fourth step of selectively etching the gate insulation film until the semiconductor substrate is exposed from the second opening, fifth step of etching the floating gate film and the gate insulation film under the floating gate film exposed from the first opening and at the same time etching the semiconductor substrate exposed from the second opening until the semiconductor substrate is exposed from the first opening, sixth step of simultaneously etching the semiconductor substrate exposed from the first opening and the second opening, and seventh step of removing the etching mask and then filling the trenches formed by the etching process with an insulating material. With this arrangement, trenches with different depths can be formed in the respective regions in a single photo-lithography process, without employing an additional etching stopper.

Embodiments of the present invention will be described in detail with reference to the accompanying drawings. FIG. 1 is a partial plan view schematically showing a configuration of a non-volatile semiconductor memory device in accordance with an embodiment of the present invention. FIGS. 15A to 15D are partial sectional views schematically showing a configuration of the non-volatile semiconductor memory device in accordance with the embodiment of the present invention.

Referring to FIG. 1, this non-volatile semiconductor memory device comprises a memory cell region 20 shown on the left side of the drawing, which includes memory cells of a MOS-transistor-type, a peripheral circuit region 22 shown on the right side of the drawing, which includes CMOS transistor circuits composing peripheral circuits for the memory cell array, and a device isolating region 21 between the memory cell region 20 and the peripheral circuit region 22 and around the peripheral circuit region 22.

Referring to FIGS. 15A–15D, each of these regions has device isolator 8a, device isolator 8b, and device isolator 8c, respectively, formed in trenches, each of which has different depth. The trenches having different depths for the device isolator 8a, device isolator 8b, and device isolator 8c are formed by a single photo-lithography (1-PR) process.

In the memory cell region 20, in which non-volatile memory cells using MOS transistors are provided, plurality of trenches 17 including the first device isolator 8a are arranged extending along the memory cells in the form of stripes between the respective cells each being made up of MOS transistors (see FIG. 1).

In the silicon substrate 1, source diffusion region 13 and drain diffusion region 12 are formed. Each source diffusion region 13 and each drain diffusion region 12 are provided in predetermined positions of a cell (see FIG. 15C).

Figure 15A:
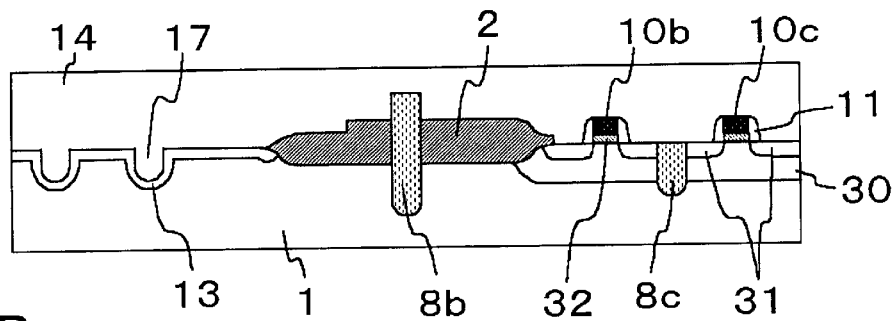
FIGS. 15A, 15B, 15C, and 15D are sectional views schematically showing a fourteenth step in the method of manufacturing the non-volatile semiconductor memory device according to the embodiment of the present invention.
Figure 15B:
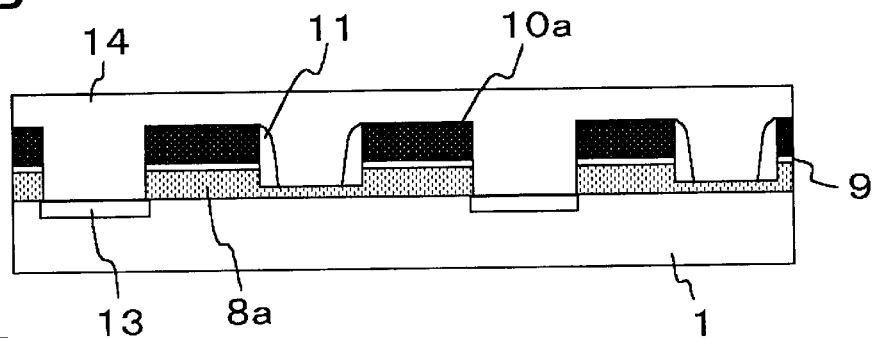

The source diffusion region 13 are arranged orthogonal to the longitudinal direction of the trench 17 extending over an area including a region of the silicon substrate 1 under the trench 17 (see FIG. 1 and FIG. 15A).

Each drain diffusion region 12 is isolated by the respective first device isolators 8a for each of the memory cells (see FIG. 1). A first gate insulation film 3, floating gate 4, second gate insulation film 9, and control gate 10a are stacked one after another in this order to compose a gate structure on a channel region between each drain diffusion region 12 and each source diffusion region 13. Side-walls 11 for the gate structure made up of these four layers are formed on both sides of drain diffusion region 12 and source diffusion region 13 (see FIG. 15C).

The first gate insulation film 3 and the floating gate 4 are isolated by the trench 17.

Figure 15C:
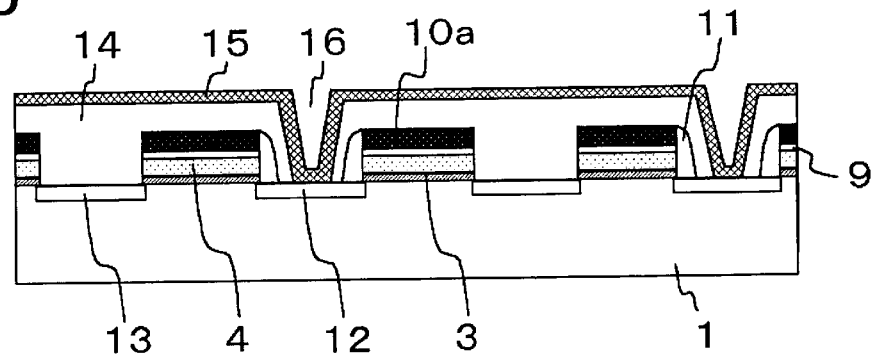
Figure 15D:
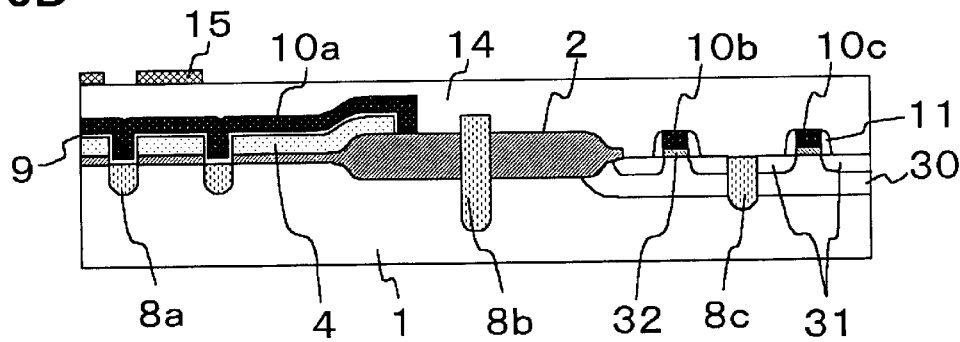

On the other hand, the second gate insulation film 9 and the control gate 10a are arranged orthogonal to the longitudinal direction of the trench 17 and are extended over the region above the device isolator 8a filled into the trench 17 (see FIG. 1, and FIG. 15D).

An aluminum wiring layer 16 is arranged extending along the memory cells above the source diffusion regions 13, drain diffusion regions 12, and control gates 10a through an inter-layer insulating layer 14.

Contact holes 16 are arranged in the inter-layer insulating layer 14 over the drain diffusion regions 12, and an aluminum wiring layer 15 establishes an electrical path with each of the drain diffusion regions 12 through the respective contact hole 16 (see FIG. 15C).

In the device isolating region 21, there are provided the field oxide film 2 and the device isolator 8b (see FIG. 1 and FIG. 15D).

The field oxide film 2 is arranged on the memory cell region 20 and surrounds the peripheral circuit region 22. The field oxide film 2 has a thickness larger than that of the first silicon oxide film 3 that becomes the first gate insulation film. The device isolator 8b is filled into a trench formed along the edge of the memory cell region 20 and located near the center of the field oxide film 2 on the silicon substrate through the field oxide film 2.

The trench for the device isolator 8b is deeper than the trenches 17 formed on the memory cell region 20.

The length or distance from the interface between the field oxide film 2 and the silicon substrate 1 on the device isolating region 21 to the base of the device isolator 8b is nearly equal to the sum of the film thickness of the floating gate 4 and the distance from the interface between the first silicon oxide film 3 and the silicon substrate 1 in the memory cell region 20 to the base of the trench 17 of each device isolator 8a.

The peripheral circuit region 22 has a plurality of circuits comprising CMOS type transistors in a peripheral region other than the memory cell region 20, and has the device isolator 8c formed between the adjacent transistors. There is provided a N-type diffusion layers 31 that becomes a source/drain region composing a transistor and a P well in the p-type silicon substrate 1. On the channel region between the source/drain regions, gate electrodes 10b and 10c are formed through the gate insulation film 3. The transistor, including an N well and a P-type diffusion layer may also be employed. CMOS circuits may have such a well known structure which has a n-well formed in the p-type silicon substrate 1 for composing an n-channel MOS transistor in which on the surface of the n-well, p-type source/drain diffusion regions are formed, and has p-type source/drain diffusion regions on the surface of the substrate 1 for composing a p-channel MOS transistor or a twin well made up of a p-well and an n-well.

The trench for the device isolator 8c is deeper than the trenches 17 formed in the memory cell region 20, but is shallower than the trench formed in the device isolating region 21.

Further, the distance from the interface between the first silicon oxide film 3 and the silicon substrate 1 in the peripheral circuit region 22 to the base of the trench for the device isolator 8c is nearly equal to the distance from the interface between the field oxide film 2 and the silicon substrate 1 in the device isolating region 21 to the base of the trench for the device isolator 8b.

Hence, the distance from the interface between the first silicon oxide film 3 and the silicon substrate 1 in the peripheral circuit region 22 to the base of the trench for the device isolator 8c is nearly equal to the sum of the film thickness of floating gate 4 and the distance from the interface between the first silicon oxide film 3 and the silicon substrate 1 in the memory cell region 20.

Next, a method for producing a non-volatile semiconductor memory device according to the embodiment of the present invention will be described with reference to the accompanying drawings. FIGS. 2 through 15 are sectional views schematically showing steps in the method for producing the non-volatile semiconductor memory device according to the embodiment of the present invention. FIGS. 2A, 3A–14A, and 15A are sectional views through line A—A in FIG. 1. FIGS. 2B, 3B–14B, and 15B are sectional views through line B—B in FIG. 1. FIGS. 2C, 3C–14C, and 15C are sectional views through line C—C in FIG. 1. FIGS. 2D, 3D–14D, and 15D are sectional views through line D—D in FIG. 1. The method according the present embodiment is characterized in that device isolating trenches are not formed before memory cells are formed, and that the device isolating trenches are formed at the time of forming the memory cells such that a plurality of the trenches having different lengths are controllably formed in a photo-lithography process.

As shown FIGS. 2A to 2D, the field oxidation film 2 is first formed on the device isolating region by a selective oxidation process. Then, the thin, first silicon oxide film 3 is formed over the entire surface of the silicon substrate 1 by thermal oxidation.

To take an example, after a silicon nitride film having an opening, not shown is patterned on the device isolating region, the field oxide film 2 is formed on the device isolating region by thermal oxidation. Thereafter, the silicon nitride film is removed. Then, the entire surface of the silicon substrate 1 is made to be subject to thermal oxidation, thereby forming the thin, first silicon oxide film 3.

For reference, the film thickness of the first silicon oxide film 3 is approximately 10 nm, while the film thickness of the field oxide film 2 is approximately 300 nm.

Next, referring to FIGS. 3A to 3D, the first polysilicon layer 4 that becomes the floating gates, having a predetermined film thickness of approximately 200 to 400 nm is formed over the entire surfaces of the field oxide film 2 and the first silicon oxide film 3 by a CVD method. Then, using the lithography technique, a first resist not shown is formed on the first polysilicon layer 4 on the memory cell region, and the first polysilicon layer on an region other than the memory cell region is removed by etching such as dry etching until the field oxide film 2 and the first silicon oxide film 3 are exposed.

Thereafter, the first resist is removed. Preferably, the film thickness of the first polysilicon layer 4 formed is measured in advance. Though the photoresist is employed as the resist herein, an etching mask that covers in advance an region to be left without being etched during the etching process can also be employed.

Next, referring to FIGS. 4A to 4D, a second silicon oxide film 5 having a film thickness of approximately 100 nm, which becomes an etching stopper, is formed over the first polysilicon layer 4, field oxide film 2, and first silicon oxide film 3 by the CVD method. Further, a silicon nitride film 6 having a film thickness of approximately 400 nm, which has large selectivity to the second silicon oxide film 5 and becomes a planarization stopper during a CMP process, is formed over the second silicon oxide film 5 by the CVD method.

Next, referring to FIGS. 5A to 5D, a second resist 7 for forming trenches in predetermined positions of the memory cell region, device isolating region, and peripheral circuit region is formed over the substrate by the lithography technique. The trench to be formed in the device isolating region is formed in only an region that needs a deep isolation such as the p well or N well, since unless otherwise, polysilicon residues are produced during polysilicon processing for forming gates in a process to be performed later.

Next, referring to FIGS. 6A to 6D, after the second resist 7 was formed, anisotropy etching such as reactive ion etching or ion beam etching is performed. With this arrangement, formation of narrow, rectangular trenches is performed in the memory cell region until the first polysilicon layer 4 is exposed, and at the same time, formation of trenches in the device isolating region and the peripheral circuit region is performed until the silicon substrate 1 is exposed.

More specifically, in respective trench-forming regions in the memory cell region, device isolating region, and peripheral circuit region, the silicon nitride film 6 is etched by using an etching gas $CF_4$ until the second silicon oxide film 5 is exposed.

Then, with the second resist 7 still remaining, in the respective trench-forming regions in the memory cell region, device isolating region, and peripheral circuit region, the second silicon oxide film 5 is etched by using an etching gas $CHF_3/CF_4$.

With these arrangements, the first polysilicon film 4 is exposed from the trenches in the memory cell region, and the field oxide film 2 is exposed from the trench in the device isolating region, and the first silicon oxide film 3 is exposed from the trench in the peripheral circuit region. Apparently, further etching will not be performed on the trenches in the memory cell region. That is, the first polysilicon film or floating gates exposed from the undersides of the trenches in the memory cell region has a high selectivity of 20 or more, so that it is hardly etched.

Then, the field oxide film 2 in the trench in the device isolating region and the first silicon oxide film 3 in the trench in the peripheral circuit region are etched by using the etching gas $CHF_3/CF_4$. The silicon substrate 1 is thereby exposed from the trench in the device isolating region, and apparently, further etching will not be performed on the trench in the peripheral circuit region.

Thereafter, by etching the field oxide film 2 in the trench in the device isolating region by using the etching gas $CHF_3/CF_4$, the silicon substrate 1 is exposed from the trench in the device isolating region, and further etching will not be apparently performed on the trench in any region.

With these arrangements described above, the surface of the first polysilicon film 4, which becomes the interface between the second silicon film 5 and the first polysilicon film 4 is exposed from the trenches in the memory cell region, and the surface of the silicon substrate 1, which becomes the interface between the first silicon oxide film 3 and the silicon substrate 1 is exposed from the trenches in the device isolating region and the peripheral circuit region.

Next, referring to FIGS. 7A to 7D, with the second resist 7 remaining, the first polysilicon film 4 exposed from the bases of the trenches in the memory cell region is etched by using an etching gas $Cl_2/HBr$ until the first silicon oxide film 3 is exposed.

Upon exposure of the first silicon oxide film 3 from the trenches in the memory cell region, etching is stopped. Apparently, further etching of the exposed first silicon oxide film 3 will not be performed. It is due to a difference between polysilicon and silicon oxide in selectivity. At the same time, the silicon substrate 1 exposed from the bases of the trenches in the device isolating region and the peripheral circuit region is etched by using the etching gas $Cl_2/HBr$. Here again, upon exposure of the first silicon oxide film 3 from the trenches in the memory cell region, etching is stopped.

With these arrangements, a film thickness $x_1$ of the first polysilicon film, a distance $L_1$ from the interface between the field oxide film 2 and the silicon substrate 1 to the base of the trench in the device isolating region, and a distance $L_2$ from the interface between the first silicon oxide film 3 and the silicon substrate 1 to the base of the trench in the peripheral circuit region can be made to be equal as long as perfect etching control is performed.

However, in the strict sense, on the trenches in the device isolating region and the peripheral circuit region, further etching is performed, so that both of the distances $L_1$ and $L_2$ are a little greater than the film thickness $x_1$.

Accordingly, if the incremented depth is represented by $\alpha$, $L_1=L_2=x_1+\alpha$ holds. The distance $\alpha$ herein is equivalent to the depth of the silicon substrate 1 etched when the first polysilicon film 4 is overetched.

Figure 16:
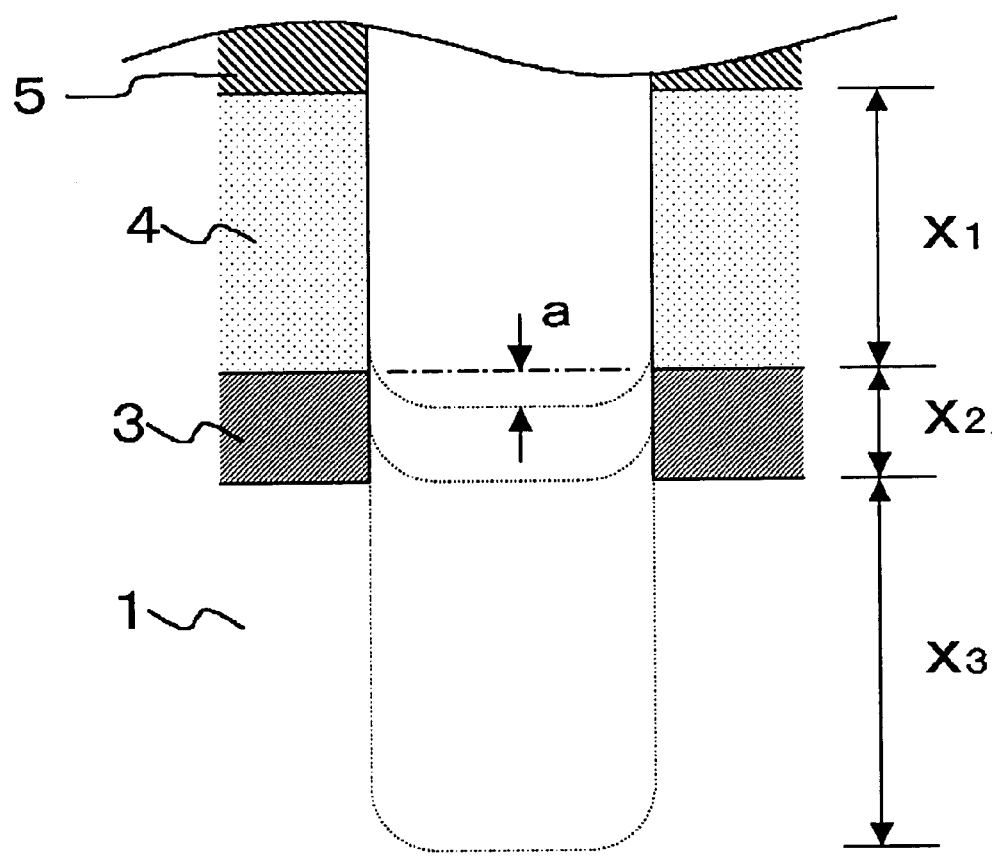
FIG. 16 is a sectional view schematically showing the depth of a trench in the method of manufacturing the semiconductor memory device according to the embodiment of the present invention.

In the process of etching the first polysilicon film 4 and the silicon substrate 1 described before, etching is stopped upon exposure of the first silicon oxide film 3. However, etching can also be continued in this case. In this case, due to a difference between silicon and silicon oxide in selectivity, an etching rate for the first silicon oxide film 3 at the bases of the trenches in the memory cell region is lower. Thus, if etching is continued, further etching of the silicon substrate 1 on the underside of the trenches in the device isolating region and the peripheral circuit region can be performed. Referring to FIG. 16, if the selectivity of silicon to silicon oxide is represented by s, where s ranges from approximately 20 to 100, and the etched depth of the first silicon oxide film 3 is represented by a, we have the following relation:

$$L_1=L_2=x_1+s$$

Thus, the distances $L_1$ and $L_2$ can be controlled until the first silicon oxide film 3 at the bases of the trenches in the memory cell region is etched away.

Meanwhile, even after the first silicon oxide film 3 at the bases of the trenches in the memory cell region is etched away, etching of the silicon substrate 1 using the etching gas Cl$_2$/HBr may be continued.

Referring to FIG. 16 again, if the selectivity of silicon to silicon oxide is represented by s, the film thickness of the first silicon oxide film 3 is represented by x$_2$, and the etched depth of the silicon substrate 1 under the trenches in the memory cell region is represented by x$_3$, we have the following relation:

$$L_1 = L_2 = x_1 + sx_2 + x_3$$

Next, suppose the case where etching by the etching gas Cl$_2$/HBr is stopped when the first silicon oxide film 3 has been exposed from the bases of the trenches in the memory cell region. Referring to FIG. 8, with the second etching mask remaining, the first silicon oxide film 3 exposed from the bases of the trenches in the memory cell region is etched by the etching gas CHF$_3$/CF$_4$ until the silicon substrate 1 is exposed. At this point, the silicon substrate 1 exposed from the base of the trench in the peripheral circuit region will hardly be etched because it has a high selectivity of 20 or more.

Next, referring to FIGS. 9A to 9D, with the second resist 7 remaining, the silicon substrate 1 near the bases of the trenches in the respective regions is etched to a depth sufficient for device isolation in the memory cell region, by using the etching gas Cl$_2$/HBr, by the self-alignment technique.

With this arrangement, we have the following relation:

$$L_1 = L_2 = x_1 + \alpha + x_3,$$

where L$_1$ designates the distance from the interface between the field oxide film 2 and the silicon substrate 1 to the base of the trench in the device isolation region, L$_2$ designates the distance from the interface between the first silicon oxide film 3 and the silicon substrate 1 to the base of the trench in the peripheral circuit region, x$_1$ designates the film thickness of the first polysilicon film, x$_3$ designates the distance from the interface between the first silicon oxide film 3 and the silicon substrate 1 to the base of a trench in the memory cell region, and α designates the distance of the over-etched depths of the trenches in the device isolating region and the peripheral circuit region when the first polysilicon film 4 at the bases of the trenches in the memory cell region is etched.

For reference, the distance x$_3$ ranges from approximately 50 to 200 nm, the distances L$_1$ and L$_2$ range from approximately 200 to 500 nm.

In this way, by making use of difference in the etching rates (termed selectivity) of Si$_3$N$_4$, SiO$_2$, and Si when Si$_3$N$_4$, SiO$_2$, and Si are respectively etched, continuous etching can be performed.

Then, trenches can be thereby formed in a single process. The second resist is removed for cleaning after formation of the trenches in the regions is completed.

Next, referring to FIGS. 10A to 10D, a third silicon oxide film 8 that becomes device isolators is formed over the silicon nitride film 6 such that the silicon oxide film is filled into the respective trenches by a high-density plasma CVD (HDP) method.

Next, referring to FIGS. 11A to 11D, the excess third silicon oxide film 8 is removed by planarizing the surface of the third silicon oxide film 8 by the Chemical Mechanical Polishing (CMP) method until the top surface of the silicon nitride film 6 is exposed.

At this time, the silicon nitride film 6 serves as a planarization stopper in the CMP process. For reference, the aspect ratio of each device isolator 8a is from approximately 3 to 3.5, and the aspect ratios of the device isolators 8b and 8c are from approximately 4 to 5.

Next, by using the etching gas CF$_4$ and making use of pronounced difference in etching rates between Si$_3$N$_4$ and SiO$_2$, the silicon nitride film 6 is etched.

Then, by using the etching gas CHF$_3$/CF$_4$, the second silicon oxide film 5 is etched until the first polysilicon film 4 is exposed.

At this stage of the process, the device isolators 8a, 8b, and 8c protrude from the top surfaces of the first polysilicon film 4, field oxide film 2, and first silicon oxide film 3, and the device isolators has almost constant heights. The device isolator 8c has the greatest protrusion height among all the device isolators.

Next, referring to FIGS. 12A to 12D, the heights of the device isolators 8a, 8b, and 8c are adjusted, and a well for the peripheral circuit region is formed.

First, a third resist not shown is formed over the entire surface of the substrate excluding the top surfaces of the device isolator 8a and the peripheral circuit region 22 by the lithography technique.

Then, by using the etching gas CHF$_3$/CF$_4$, etching is performed until the silicon substrate 1 in the peripheral circuit region 22 is exposed, and then the third resist is removed.

Thereafter, a fourth resist not shown is formed over the entire surface of the substrate excluding the top surfaces of the device isolators 8a by the lithography technique.

Then, implantation of ions such as boron ions or boron fluoride ions is performed into the silicon substrate 1 in the peripheral circuit region 22 to form the P-well 30.

Then, the fourth resist is removed. The depth of the device isolator 8c reaches the depth of the P-well 30. However, the device isolator 8c does not always need to be formed as described above.

When a difference between the depth of the source/drain region to be formed later and the depth of the device isolator 8c is sufficiently great, the operation of a parasitic bipolar transistor made up of source/drain of adjacent transistors and a well can be suppressed. Accordingly, the depth of the device isolator 8c does not always need to reach the depth of the P-well 30.

Figure 13A:
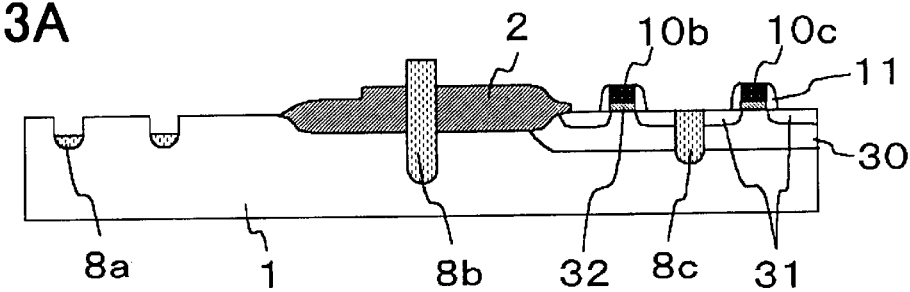
FIGS. 13A, 13B, 13C, and 13D are sectional views schematically showing a twelfth step in the method of manufacturing the non-volatile semiconductor memory device according to the embodiment of the present invention.
Figure 13B:
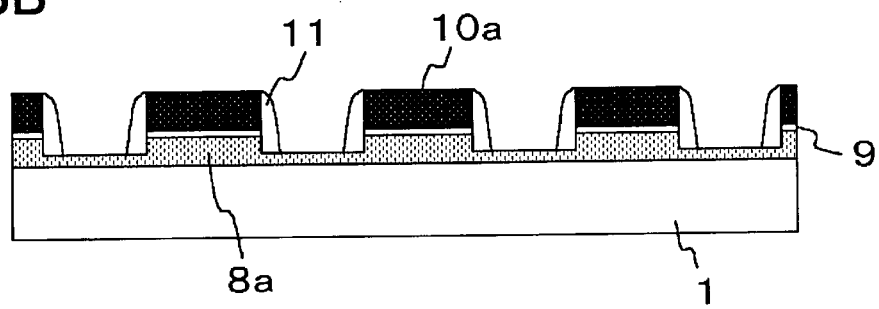
Figure 13C:
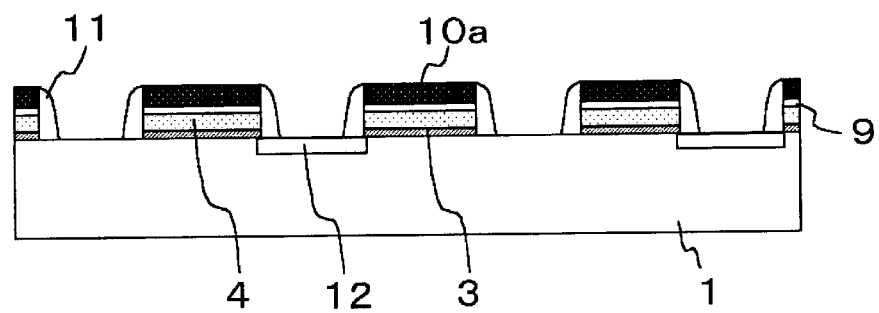
Figure 13D:
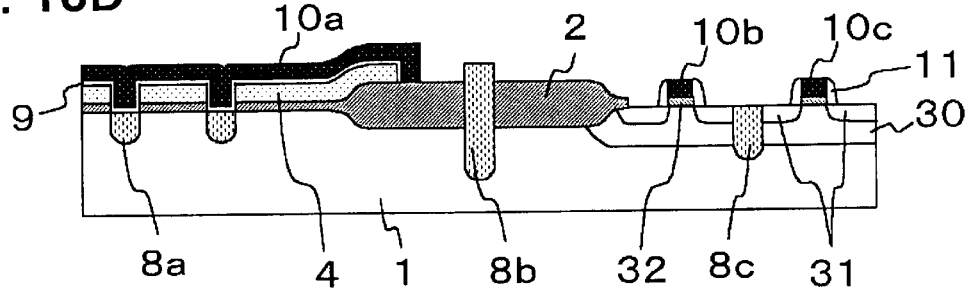
Figure 14A:
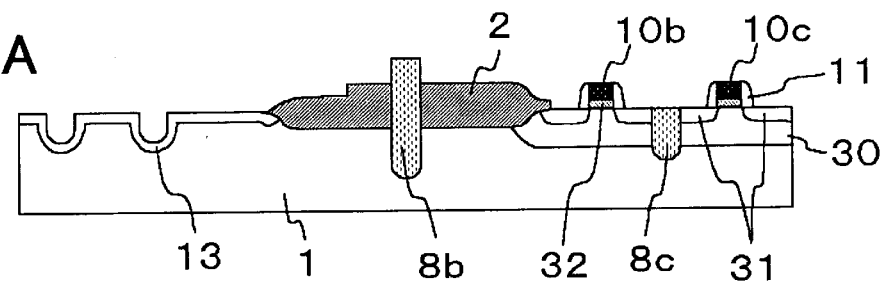
FIGS. 14A, 14B, 14C, and 14D are sectional views schematically showing a thirteenth step in the method of manufacturing the nonvolatile semiconductor memory device according to the embodiment of the present invention.
Figure 14B:
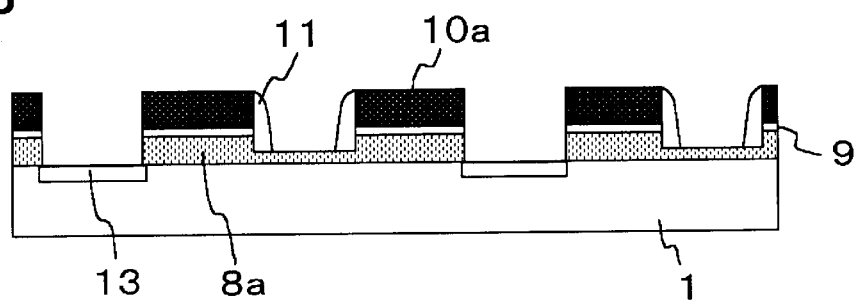
Figure 14C:
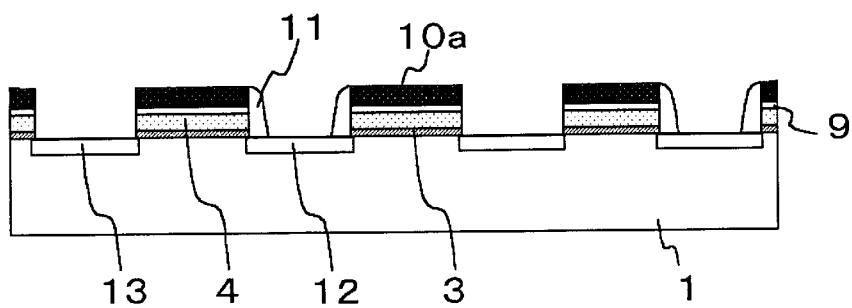
Figure 14D:
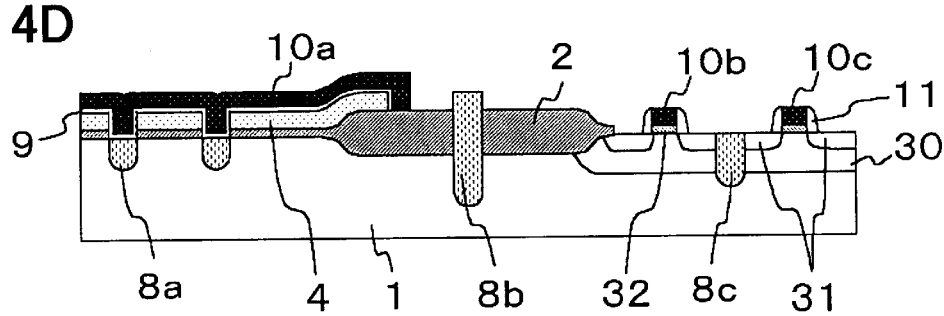

Next, referring to FIG. 13D, the ONO film 9 in which SiO$_2$, Si$_3$N$_4$, and SiO$_2$ are stacked one after another in this order by the CVD method is formed over the entire top surface of the substrate.

Then, a fifth resist now shown is formed on the ONO film on the memory cell region by the lithography technique, and then the ONO film 9 on the device isolating region and the peripheral circuit region is continuously etched away by using the etching gases CHF$_3$/CF$_4$, CF$_4$, CHF$_3$/CF$_4$ in this order, and then the fifth resist is removed.

Thereafter, gate oxidation for the peripheral circuit region is performed to form the gate insulation film 32 on the peripheral circuit region. The ONO film is employed herein to increase the dielectric constant.

Next, referring to FIGS. 13A to 13D, a second polysilicon film 10 that becomes the control gate 10a on the memory cell region and the gate electrodes 10b and 10c on the peripheral circuit region is formed.

Then, a sixth resist, not shown, for patterning the control gate 10a on the memory cell region and the gate electrodes 10b and 10c on the peripheral circuit region is formed on the second polysilicon film 10 by the lithography technique.

Then, the second polysilicon film 10, ONO film 9, first polysilicon film 4, first silicon oxide film 3, part of the device isolators 8a, part of the field oxide film 2, and gate insulation film 32 are continuously etched by using the etching gases $Cl_2$/HBr, $CHF_3$/$CF_4$, $CF_4$, $Cl_2$/HBr, $Cl_2$/HBr, and $Cl_2$/HBr, in this order until the silicon substrate 1 is exposed, for patterning.

After patterning, the sixth resist is removed. This patterning causes the control gate 10a made up of the second polysilicon film to be arranged with a predetermined width in a direction perpendicular to the longitudinal direction of the device isolators 8a, seen from above. The floating gate 4, which is made up of the first polysilicon film, is formed over the silicon substrate 1 that is not covered with the device isolators 8a through the first gate insulation film 3.

The first gate insulation film 3 comprises the first silicon oxide film. Each floating gate 4 is formed to have the width substantially equal to the width of each control gate 10a, seen from above.

Further, the second gate insulation film 9, which comprises the ONO film, is formed to be aligned with the first polysilicon film that comprises the floating gates 4, seen from above, and is interposed between the floating gate 4 and the control gate 10a.

Next, referring to FIGS. 13A to 13D, a seventh resist, not shown, for forming the drain diffusion regions 12 in the memory cell region and the source/drain regions 31 in the peripheral circuit region is formed over the substrate by the lithography technique.

Then, N-type impurity ions such as arsenic ions are ion implanted into the silicon substrate 1 to form the drain diffusion region 12 in the memory cell region and the source drain region 31 in the peripheral circuit region.

The transistor according to the present embodiment has a typical LDD (lightly doped drain) structure. Accordingly, the side walls 11 are formed on the sides of the gate of each of the transistors on the memory cell region and the peripheral circuit region. At this point, the drain diffusion region 12 is formed to be isolated, with the device isolator 8a serving as an ion implantation stopper.

Thereafter, the side walls 11 are formed on the sides of a gate structure being made up of the first gate insulation film 3, floating gates 4, second gate insulation film 9, and control gates 10a. The side walls 11 are also formed on the sides of gate structures each being made up of a first gate insulation film 3 and gate electrodes 10b and 10c. Then, the seventh resist is removed.

Next, referring to FIGS. 14A to 14D, an eighth resist not shown, for forming the source diffusion regions 13 is formed by the lithography technique, and the device isolator 8a and the side walls 11 are etched by using the etching gas $CHF_3$/$CF_4$ until the silicon substrate 1 is exposed from the bases of the trenches where the device isolators 8a are formed.

Next, N-type impurity ions such as phosphorus ions are ion implanted into the silicon substrate 1 with the eighth resist remaining.

Then, N-type impurity ions such as arsenic ions are ion implanted to form the source diffusion regions 13.

Thereafter, the eighth resist is removed. With this arrangement, the source diffusion regions 13 which continuously cross with the trenches for the device isolators 8a at a right angle, seen from above, are formed.

When this ion implantation is performed, the source/drain regions 31 are not formed in the peripheral circuit region.

When the source/drain regions 31 are not formed in the peripheral circuit region at the time of formation of the drain diffusion regions 12, the source/drain regions 31 may also be formed at the time of formation of the source diffusion regions 13 simultaneously.

Next, referring to FIGS. 15A to 15D, after the inter-layer dielectric film 14 is deposited over the substrate, contact holes are formed in the respective drain diffusion regions 12.

Then, the aluminum wiring layer 15 is deposited thereon, and the aluminum wiring layer 15 is patterned by using a ninth resist not shown. With these arrangements, the non-volatile semiconductor memory device can be finally obtained.

Another embodiment of the present invention will be described. FIGS. 17a–17e are sectional views schematically showing trench-forming steps in a method of manufacturing a non-volatile semiconductor memory device according to another embodiment of the present invention.

This embodiment is same as the embodiment described above in that the field oxide film 2 and the first silicon oxide film 3 are formed, and then the first polysilicon layer 4 is selectively formed. Thereafter, the second resist 7 for forming trenches in predetermined positions of the memory cell region, device isolating region, and peripheral circuit region is formed over the substrate (see FIG. 17a). Meanwhile either one of a silicon oxide film or a silicon nitride film may be interposed between the second resist 7 and the substrate, as necessary.

After the second resist 7 is formed, anisotropy etching such as reactive ion etching or ion beam etching is performed. With this arrangement, formation of stripe like trenches in the memory cell region is performed and continued until the first polysilicon layer 4 is exposed, and at the same time, formation of trenches in the device isolating region and the peripheral circuit region is performed and trench formation process is continued until the silicon substrate 1 is exposed (see FIG. 17b).

Figure 17C:
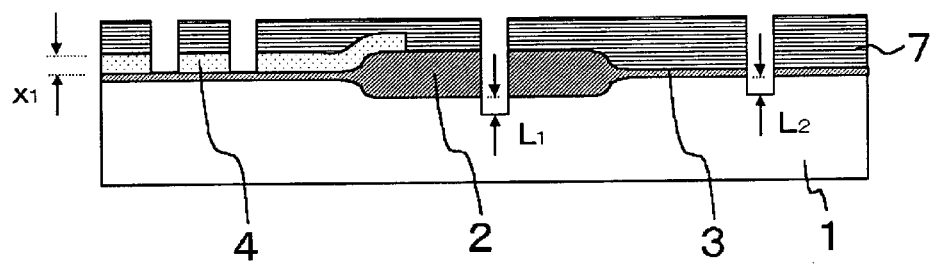

Next, with the second resist 7 remaining, the first polysilicon film 4 exposed from the base of the trenches in the memory cell region is etched by using the etching gas $Cl_2$/HBr until the first silicon oxide film 3 is exposed, and at the same time, the silicon substrate 1 exposed from the bases of the trenches in the device isolating region and the peripheral circuit region is etched by using the etching gas $Cl_2$/HBr (see FIG. 17c).

With this arrangement, as in the embodiment described before, we have the following relation;

$$L_1 = L_2 = x_1 + \alpha,$$

where $L_1$ designates the distance from the interface between the field oxide film 2 and the silicon substrate 1 to the base of the trench in the device isolating region, $L_2$ designates the distance from the interface between the first silicon oxide film 3 and the silicon substrate 1 to the base of the trench in the peripheral circuit region, $x_1$ designates the film thickness of the first polysilicon film, and $\alpha$ designates the depth of over-etched the trench of the device isolating region and the peripheral circuit region.

In this embodiment as well, as in the embodiment described before, etching may also be continued even after the first silicon oxide film 3 is exposed.

Figure 17D:
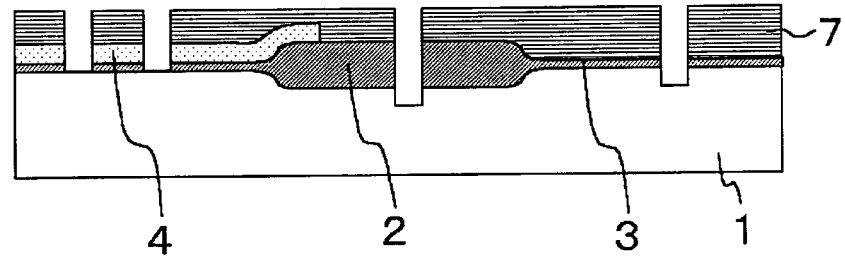

After etching by using the etching gas $Cl_2$/HBr is stopped upon exposure of the first silicon oxide film 3 from the trenches in the memory cell region, by using the etching gas CHF$_3$/CF$_4$ and with the second etching mask remaining, the first silicon oxide film exposed from the trenches in the memory cell region is etched until the silicon substrate 1 is exposed (see FIG. 17d).

Figure 17E:
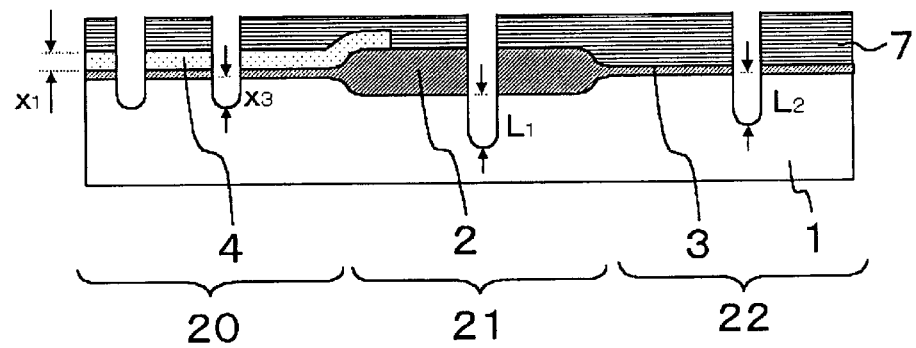
Figure 18A:
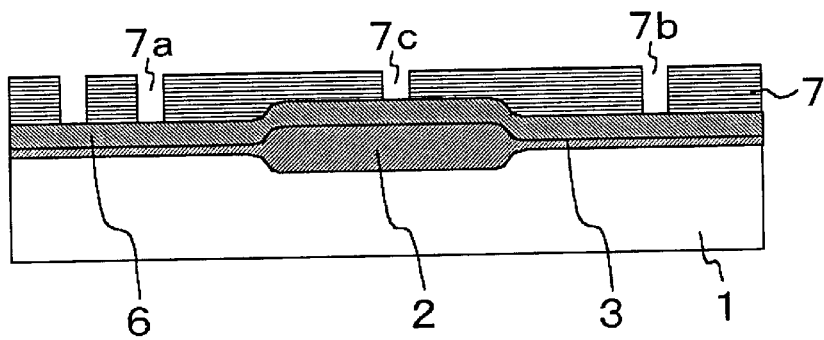
FIGS. 18a, 18b, 18c, and 18d are sectional views schematically showing steps in a method of manufacturing a conventional non-volatile semiconductor memory device.
Figure 18B:
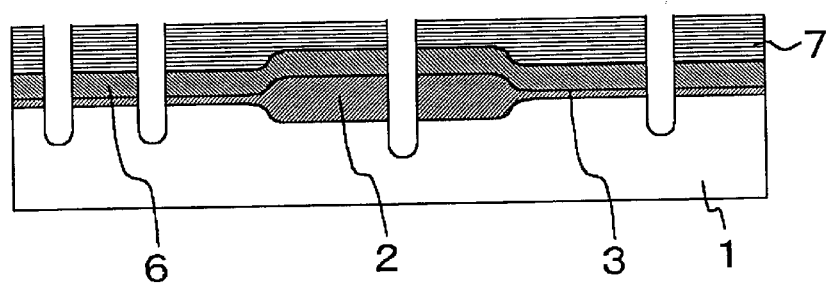
Figure 18C:
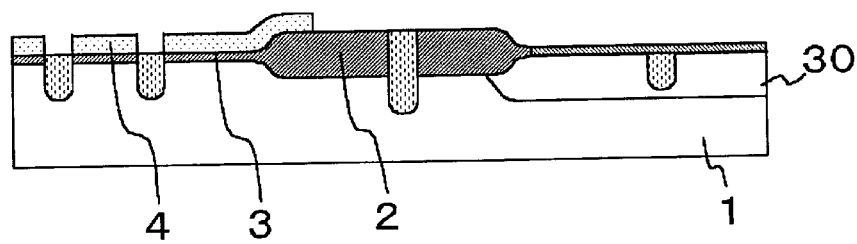
Figure 18D:
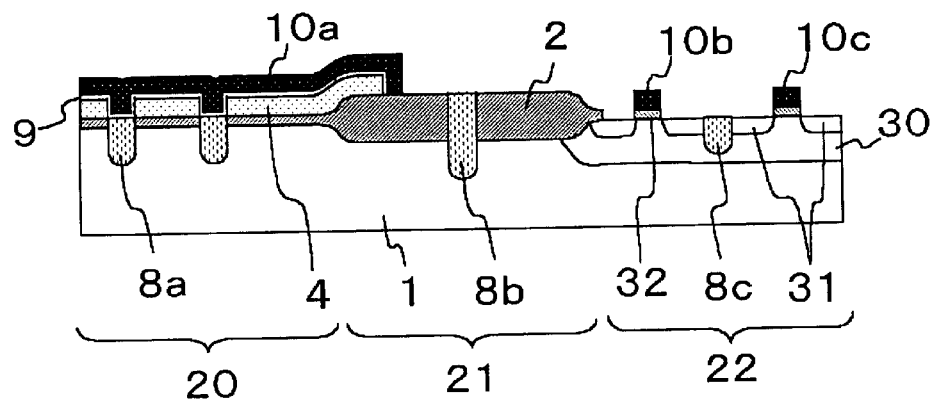

Next, with the second resist 7 still remaining, the silicon substrate 1 around the bases of the trenches in the respective regions is etched to a depth sufficient for device isolation in the memory cell region, using the etching gas Cl$_2$/HBr, by the self-alignment technique (see FIG. 17e). With this arrangement, we have the following relation:

$$L_1 = L_2 = x_1 + \alpha + x_3$$

where $x_3$ designates the distance from the interface between the first silicon oxide film 3 and the silicon substrate 1 to the base of the trench in the memory cell region, $L_1$ designates the distance from the interface between the field oxide film 2 and the silicon substrate 1 to the base of the trench in the device isolating region, $L_2$ designates the distance from the interface between the first silicon oxide film 3 and the silicon substrate 1 to the base of the trench in the peripheral circuit region, $x_1$ designates the film thickness of the first polysilicon film, and $\alpha$ designates the length of the overetched depths of the trenches in the device isolating region and the peripheral circuit region when the first polysilicon film 4 in the trenches of the memory cell region is etched.

As described above, in this embodiment as well, by making use of a pronounced difference in the etching rates (termed selectivity) of Si and SiO$_2$ when Si and SiO$_2$ are respectively etched, continuous etching can be performed. Formation of trenches can be thereby performed in a single process.

The meritorious effects of the present invention are summarized as follows.

According to the present invention, by using an identical mask, device isolation trenches having different depths, in which a trench in a peripheral circuit region being deeper than a trench in a memory cell region, can be formed in the peripheral circuit region and the memory cell region, without increasing the number of processes.

Especially, according to the present invention, at the time of trench formation, a device isolation trench can be formed in the memory cell region by a self-alignment technique. The miniaturization of the device isolators thus can be achieved, because a design allowance for mask alignment is not required.

According to the present invention, a trench in a peripheral circuit region is formed to extend through a field oxide film that has been subject to LOCOS oxidation, and a device isolator is formed to cover a deep trench formed in a silicon substrate, so that isolation of P/N well that requires a deep isolation characteristic can be performed.

Further, according to the present invention, since a trench in the memory cell region can be arbitrarily made to be shallow, the self-alignment technique can be employed. With this technique, by the LOCOS process performed once and STI (Shallow Trench Isolation) process performed once, three types of isolators which comprise self-alignment STI isolators in a memory cell region, an STI isolator in a field oxide film in a device isolating region, and an STI isolator in a peripheral circuit region can be formed.

If the STI process is normally employed, the process of forming marks for mask alignment is initially required. However, by forming peripheral fields for this purpose, an increase in the number of the processes resulting from use of both of the LOCOS process and the trench isolation process can be prevented.

Further, according to the present invention, by forming a polysilicon film that becomes a floating gate on a memory cell region alone in advance, self-aligning etching of a floating gate and a silicon substrate for formation of a Flash memory cell, and etching of a peripheral circuit region where device isolation by a deep trench is required can be performed simultaneously. In addition, filling the isolators into the trenches and planarization (CMP) for the respective trench isolators can also be performed simultaneously.

According to the present invention, device isolators in the memory cell region serves both as an etching stopper for cell-gate etching and a mask when arsenic ion implantation into source/drain regions in a memory cell region is performed. Further, a trench in the memory cell region do not have to be deep for cell isolation. On the contrary, in order to employ the self-alignment technique, the shallow trench is suitable. The depth of the trench can be adjusted to be the one required, relative to the depth of the trench in the peripheral circuit region.

According to the present invention, since the device isolator formed to protrude from the field oxide film had undergone the LOCOS oxidation process and the normal trench isolation process, there may be a case in which a height difference between the device isolators remains. However, the present invention may well be practiced if a region where the invention is applied is confined.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for producing a non-volatile semiconductor memory device having a memory cell region and a peripheral circuit region, said memory cell region including a plurality of memory cells each comprising a floating-gate transistor, said peripheral circuit region including at least a transistor circuit in a periphery of said memory cell region, said method comprising:

a first step of forming a gate insulation film on a semiconductor substrate;

a second step of forming a floating gate film on said gate insulation film and then selectively etching said floating gate film on said peripheral circuit region;

a third step of forming an etching mask having at least a first opening and a second opening respectively over said floating gate film and said gate insulation film, said first opening being provided to expose a part of said floating gate film on said memory cell region, said second opening being provided to expose a part of said gate insulation film on said peripheral circuit region;

a fourth step of selectively etching said gate insulation film until said semiconductor substrate is exposed from said second opening;

a fifth step of etching said floating gate film exposed from said first opening and said gate insulation film under said floating gate film, and etching said semiconductor substrate exposed from said second opening simultaneously, until said semiconductor substrate is exposed from said first opening;

a sixth step of simultaneously etching said semiconductor substrate exposed respectively from said first opening and said second opening; and a seventh step of removing said etching mask and then filling respective trenches formed by said sixth step of etching with an insulating material.

2. The method as defined in claim 1, further comprising after said seventh step:

an eighth step of forming a well in said semiconductor substrate in said peripheral circuit region.

3. The method as defined in claim 2, wherein the trench formed in said peripheral circuit region is deeper than the well formed in said peripheral circuit region.

4. The method as defined in claim 1, wherein the trench formed in said peripheral circuit region is deeper than the trench formed in said memory cell region.

5. The method as defined in claim 1, wherein the trench formed in said memory cell region isolates a floating gate of said respective memory cells.

6. The method as defined in claim 1, wherein the trench formed in said peripheral circuit region is formed in a source/drain region between adjacent transistors.

7. The method defined as claim 1, wherein said etching mask is a photo resist.

8. The method defined in claim 1, wherein said etching mask is a CMP stopper.

9. A method for producing a non-volatile semiconductor memory device having a memory cell region, a peripheral circuit region, and a device isolating region on a semiconductor substrate, said memory cell region having a plurality of memory cells each comprising a floating-gate transistor, said peripheral circuit region including at least a transistor circuit in a periphery of said memory cell region, said device isolating region for isolating devices on said memory cell region from devices on said peripheral circuit region, said method comprising:

a first step of forming a field insulating film on said device isolating region and then forming a gate insulation film on said memory cell region and said peripheral circuit region;

a second step of forming a floating gate film on said gate insulation film and then selectively etching said floating gate film on said peripheral circuit region;

a third step of forming an etching mask having at least a first opening and another opening, said first opening being provided to expose a part of said floating gate film on said memory cell region, said other opening being provided to expose a part of said field insulating film on said device isolating region;

a fourth step of selectively etching said field insulating film exposed from said other opening until said semiconductor substrate is exposed from said other opening;

a fifth step of etching said floating gate film exposed from said first opening and said gate insulation film under said floating gate film, and etching said semiconductor substrate exposed from said other opening simultaneously, until said semiconductor substrate is exposed from said first opening;

a sixth step of simultaneously etching said semiconductor substrate exposed respectively from said first opening and said other opening; and a seventh step of removing said etching mask and then filling respective trenches formed by said sixth step of etching with an insulating material.

10. The method as defined in claim 9, wherein in said fifth step, after simultaneously etching said floating gate film exposed from said first opening and said semiconductor substrate exposed from said other opening, until said gate insulation film is exposed from said first opening, said gate insulation film exposed from said first opening is selectively etched until said semiconductor substrate is exposed from said first opening.

11. The method as defined in claim 9, further comprising after said seventh step:

an eighth step of forming a well in said semiconductor substrate in said peripheral circuit region.

12. The method as defined in claim 9, wherein said etching mask is a photo resist.

13. The method defined in claim 9, wherein said etching mask is a CMP stopper.

14. A method for producing a non-volatile semiconductor memory device having a memory cell region, a peripheral circuit region, and a device isolating region on a semiconductor substrate, said memory cell region having a plurality of memory cells each comprising a floating-gate transistor, said peripheral circuit region including at least a transistor circuit in a periphery of said memory cell region, said device isolating region for isolating devices on said memory cell region from devices on said peripheral circuit region, said method comprising:

a first step of forming a field insulating film on said device isolating region and then forming a gate insulation film on said memory cell region and said peripheral circuit region;

a second step of forming a floating gate film on said gate insulation film and then selectively etching said floating gate film on said peripheral circuit region;

a third step of forming an etching mask having at least a first opening, a second opening, and a third opening, said first opening being provided to expose a part of said floating gate film on said memory cell region, said second opening being provided to expose a part of said gate insulation film on said peripheral circuit region, said third opening being provided to expose a part of said field insulating film on said device isolating region;

a fourth step of selectively etching said gate insulation film exposed from said second opening and said field insulating film exposed from said third opening until said semiconductor substrate is exposed from said second opening and said third opening;

a fifth step of etching said floating gate film exposed from said first opening and said gate insulation film under said floating gate film, and etching said semiconductor substrate exposed from said second opening and said third opening simultaneously, until said semiconductor substrate is exposed from said first opening;

a sixth step of simultaneously etching said semiconductor substrate exposed respectively from said first opening, said second opening, and said third opening; and a seventh step of removing said etching mask and then filling respective trenches formed by said sixth step of etching with an insulating material.

15. The method as defined in claim 14, wherein in said fifth step, after simultaneously etching said floating gate film exposed from said first opening and said semiconductor substrate exposed from said second opening or said third opening until said gate insulation film is exposed from said first opening, said gate insulation film exposed from said first opening is selectively etched until said semiconductor substrate is exposed from said first opening.

16. The method as defined in claim 14, further comprising after said seventh step:

an eighth step of forming a well in said semiconductor substrate in said peripheral circuit region.

17. The method as defined in claim 16, wherein the trench formed in said peripheral circuit region is deeper than the well formed in said peripheral circuit region.

18. The method as defined in claim 14, wherein said etching mask is a photo resist.

19. The method defined in claim 14, wherein said etching mask is a CMP stopper.

* * * * *